United States Patent
Mikado et al.

(10) Patent No.: US 9,232,656 B2
(45) Date of Patent: Jan. 5, 2016

(54) WIRING BOARD AND METHOD FOR MANUFACTURING THE SAME

(71) Applicant: IBIDEN CO., LTD., Ogaki-shi (JP)

(72) Inventors: Yukinobu Mikado, Ogaki (JP); Mitsuhiro Tomikawa, Ogaki (JP); Yusuke Tanaka, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/175,128

(22) Filed: Feb. 7, 2014

(65) Prior Publication Data

US 2014/0153205 A1 Jun. 5, 2014

Related U.S. Application Data

(63) Continuation of application No. 13/455,295, filed on Apr. 25, 2012, now Pat. No. 8,693,209.

(60) Provisional application No. 61/485,835, filed on May 13, 2011.

(51) Int. Cl.
*H05K 1/18* (2006.01)
*H01L 23/498* (2006.01)
(Continued)

(52) U.S. Cl.
CPC .......... *H05K 1/185* (2013.01); *H01L 23/49822* (2013.01); *H01L 23/50* (2013.01); *H01L 24/19* (2013.01); *H05K 3/306* (2013.01); *H01L 2224/04105* (2013.01); *H01L 2224/2518* (2013.01); *H01L 2224/32225* (2013.01); *H01L 2224/73267* (2013.01); *H01L 2924/15153* (2013.01); *H05K 3/4602* (2013.01); *H05K 2201/1003* (2013.01);
(Continued)

(58) Field of Classification Search
CPC ............ H05K 1/00; H05K 1/11; H05K 1/16; H05K 1/18; H05K 3/10; H01L 21/02; H01L 21/56; H01L 21/60; H01L 21/70; H01L 21/98; H01L 23/02; H01L 23/48; H01L 23/50
USPC .......... 361/763, 762, 705, 760; 174/250, 260, 174/266; 438/250, 260, 266; 257/250, 260, 257/266; 29/829
See application file for complete search history.

(56) References Cited

U.S. PATENT DOCUMENTS 5,777,847 A 7/1998 Tokuno et al.
6,002,592 A * 12/1999 Nakamura et al. ............ 361/760

(Continued)

FOREIGN PATENT DOCUMENTS

JP 2002-118368 4/2002
JP 2005-72415 A 3/2005
(Continued)

*Primary Examiner* — Xiaoliang Chen
(74) *Attorney, Agent, or Firm* — Oblon, McClelland, Maier & Neustadt, L.L.P.

(57) ABSTRACT

A wiring board includes a substrate having an opening portion, multiple electronic devices positioned in the opening portion such that the electronic devices are arrayed in the lateral direction of each of the electronic devices, and an insulation layer formed on the substrate such that the insulation layer covers the electronic devices in the opening portion of the substrate. The substrate has a wall surface defining the opening portion and formed such that the opening portion is partially partitioned and the electronic devices are kept from making contact with each other.

21 Claims, 26 Drawing Sheets

(51) Int. Cl.
　　　*H01L 23/50*　　(2006.01)
　　　*H01L 23/00*　　(2006.01)
　　　*H05K 3/30*　　(2006.01)
　　　*H05K 3/46*　　(2006.01)

(52) U.S. Cl.
　　　CPC ............... *H05K 2201/10015* (2013.01); *H05K 2201/10636* (2013.01); *H05K 2203/1469* (2013.01); *Y10T 29/49124* (2015.01); *Y10T 29/49139* (2015.01)

(56) References Cited

U.S. PATENT DOCUMENTS

| | | | |
|---|---|---|---|
| 7,696,005 B2 * | 4/2010 | Iihola et al. | 438/107 |
| 8,331,102 B2 * | 12/2012 | Inagaki et al. | 361/765 |
| 2004/0043533 A1 * | 3/2004 | Chua et al. | 438/106 |
| 2004/0046250 A1 | 3/2004 | Chua et al. | |
| 2004/0095710 A1 * | 5/2004 | Miki et al. | 361/523 |
| 2005/0073029 A1 | 4/2005 | Chua et al. | |
| 2005/0255303 A1 | 11/2005 | Sawatari et al. | |
| 2005/0258447 A1 * | 11/2005 | Oi et al. | 257/100 |
| 2006/0154496 A1 | 7/2006 | Imamura et al. | |
| 2006/0260122 A1 | 11/2006 | Honjo et al. | |
| 2007/0085188 A1 * | 4/2007 | Chang et al. | 257/686 |
| 2007/0195511 A1 | 8/2007 | Imamura et al. | |
| 2008/0163486 A1 | 7/2008 | Imamura et al. | |
| 2008/0196932 A1 | 8/2008 | Sawatari et al. | |
| 2009/0286357 A1 | 11/2009 | Beer | |
| 2010/0328915 A1 * | 12/2010 | Inagaki et al. | 361/764 |
| 2011/0019383 A1 * | 1/2011 | Aoyama et al. | 361/792 |
| 2012/0176776 A1 * | 7/2012 | Van Herpen et al. | 362/147 |
| 2013/0009325 A1 * | 1/2013 | Mori et al. | 257/774 |
| 2013/0182401 A1 | 7/2013 | Furutani et al. | |
| 2013/0194764 A1 | 8/2013 | Mikado et al. | |
| 2013/0284506 A1 | 10/2013 | Zanma et al. | |

FOREIGN PATENT DOCUMENTS

| | | |
|---|---|---|
| JP | 2005-311249 A | 11/2005 |
| JP | 2009-105345 A | 5/2009 |
| JP | 4684368 B2 | 5/2011 |

\* cited by examiner

WIRING BOARD AND METHOD FOR MANUFACTURING THE SAME

CROSS-REFERENCE TO RELATED APPLICATIONS

This application is a continuation of U.S. Ser. No. 13/455,295, filed Apr. 25, 2012, which claims the benefit of priority to U.S. Ser. No. 61/485,835, filed May 13, 2011. The entire contents of these applications are incorporated herein by reference.

BACKGROUND OF THE INVENTION

1. Field of the Invention

The present invention relates to a wiring board and its manufacturing method.

2. Discussion of the Background

In Japanese Laid-Open Patent Publication No. 2002-118368, a wiring board having the following is described: a substrate with an opening portion; multiple electronic components accommodated in the opening portion; an insulation layer formed on the substrate and on the electronic components; a conductive layer formed on the insulation layer; and via conductors electrically connecting the conductive layer and electrodes of the electronic components. The contents of Japanese Laid-Open Patent Publication No. 2002-118368 are incorporated herein by reference in their entirety in the present application.

SUMMARY OF THE INVENTION

According to one aspect of the present invention, a wiring board includes a substrate having an opening portion, multiple electronic devices positioned in the opening portion such that the electronic devices are arrayed in the lateral direction of each of the electronic devices, and an insulation layer formed on the substrate such that the insulation layer covers the electronic devices in the opening portion of the substrate. The substrate has a wall surface defining the opening portion and formed such that the opening portion is partially partitioned and the electronic devices are kept from making contact with each other.

According to another aspect of the present invention, a method for manufacturing a wiring board includes forming in a substrate an opening portion which accommodates multiple electronic device and which is defined by a wall surface formed such that the opening portion is partially partitioned and the electronic devices are kept from making contact with each other, positioning multiple electronic devices in the opening portion such that the electronic devices are kept from making contact with each other by the wall surface and that the electronic devices are arrayed in the lateral direction of each of the electronic devices, and forming an insulation layer on the substrate such that the insulation layer covers the electronic devices in the opening portion of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
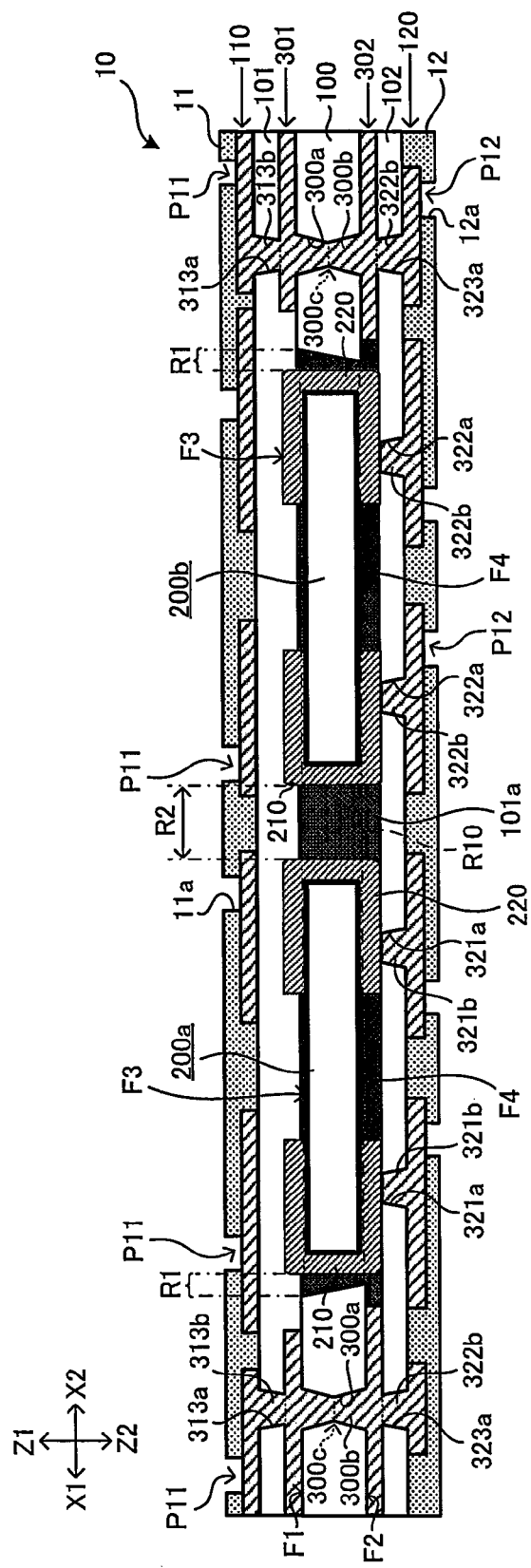
FIG. 1 is a cross-sectional view of a wiring board according to an embodiment of the present invention.

The embodiments will now be described with reference to the accompanying drawings, wherein like reference numerals designate corresponding or identical elements throughout the various drawings.

Arrows (Z1, Z2) each indicate a lamination direction of a wiring board (or a thickness direction of the wiring board) corresponding to a direction along a normal line to main surfaces (upper and lower surfaces) of the wiring board. On the other hand, arrows (X1, X2) and (Y1, Y2) each indicate a direction perpendicular to a lamination direction (or to a side of each layer). Main surfaces of the wiring board are on the X-Y plane, and side surfaces of the wiring board are on the X-Z plane or the Y-Z plane.

Two main surfaces facing opposite directions of a normal line are referred to as a first surface or a third surface (a Z1-side surface) and a second surface or a fourth surface (a Z2-side surface). In lamination directions, the side closer to the core is referred to as a lower layer (or inner-layer side), and the side farther from the core is referred to as an upper layer (or outer-layer side). "Being directly on" means a direction Z (Z1 side or Z2 side). A planar shape means a shape on the X-Y plane or the X-Y plane unless specifically indicated.

A conductive layer is a layer formed with one or multiple conductive patterns. A conductive pattern may include a conductive pattern that forms an electrical circuit, such as wiring (including ground), pad, land or the like; or it may include a planar conductive pattern that does not form an electrical circuit.

Opening portions include notches and cuts in addition to holes and grooves. Holes are not limited to penetrating holes, but also include non-penetrating holes. Holes include via holes and through holes. In the following, the conductor formed in a via hole (on the wall surface or bottom surface) is referred to as a via conductor, and the conductor formed in a through hole (on the wall surface) is referred to as a through-hole conductor.

Plating includes wet plating such as electrolytic plating as well as dry plating such as PVD (physical vapor deposition) and CVD (chemical vapor deposition).

"Being surrounded" includes situations such as a region completely enclosed by an unbroken ring, a region surrounded by a dotted-line ring, or the like. A ring means a planar shape formed by connecting both ends of a line, and includes polygons in addition to a circle.

"Preparing" includes situations in which material and components are purchased and manufactured accordingly as well as situations in which finished products are purchased and used accordingly.

"An electronic device to be positioned in an opening portion" includes a situation in which the entire electronic device is completely accommodated in an opening portion, as well as situations in which only part of an electronic component is positioned in an opening portion.

As shown in FIG. 1, wiring board 10 of the present embodiment includes substrate 100 (insulative substrate), insulation layers (101, 102) (interlayer insulation layers), conductive layers (110, 120), electronic components (200a, 200b) (electronic devices), and solder resists (11, 12). Electronic components (200a, 200b) are each built into wiring board 10. Wiring board 10 of the present embodiment is a rigid wiring board. However, wiring board 10 may also be a flexible wiring board. In the following, either one of the upper and lower surfaces (two main surfaces) of substrate 100 is referred to as first surface (F1) and the other as second surface (F2). In addition, of the upper and lower surfaces (two main surfaces) of electronic components (200a, 200b), the surface facing the same direction as first surface (F1) is referred to as third surface (F3), and the other as fourth surface (F4).

Substrate 100 is insulative, and becomes the core substrate of wiring board 10. Through hole (300a) is formed in substrate 100 (core substrate), and through-hole conductor (300b) is formed by filling conductor (such as copper plating) in through hole (300a). The shape of through-hole conductor (300b) is similar to that of an hourglass, for example. Namely, through-hole conductor (300b) has narrowed portion (300c), and the width of through-hole conductor (300b) decreases gradually as it comes closer to narrowed portion (300c) from first surface (F1), and decreases gradually as it comes closer to narrowed portion (300c) from second surface (F2). However, that is not the only option, and the shape of through-hole conductor (300b) may be determined freely. For example, it may be substantially a column.

Conductive layer 301 is formed on first surface (F1) of substrate 100, and conductive layer 302 is formed on second surface (F2) of substrate 100. Conductive layers (301, 302) each include a land of through-hole conductor (300b). Conductive layer 301 and conductive layer 302 are electrically connected to each other by through-hole conductor (300b).

Substrate 100 includes an opening portion that penetrates through substrate 100. In particular, cavity (R10) is formed in substrate 100 as an opening portion. Electronic components (200a, 200b) are accommodated in cavity (R10). In the present embodiment, cavity (R10) is a hole that penetrates through substrate 100. Electronic components (200a, 200b) are each arrayed in cavity (R10) to be positioned in a side direction (a direction X or Y) of substrate 100. Namely, in the present embodiment, multiple electronic devices (electronic components (200a, 200b)) are positioned in one opening portion (cavity R10). In addition, in the present embodiment, substantially entire electronic components (200a, 200b) are each accommodated completely in cavity (R10). However, the present embodiment is not limited to such, and it is also an option for only part of electronic components (200a, 200b) to be positioned in cavity (R10).

Figure 2:
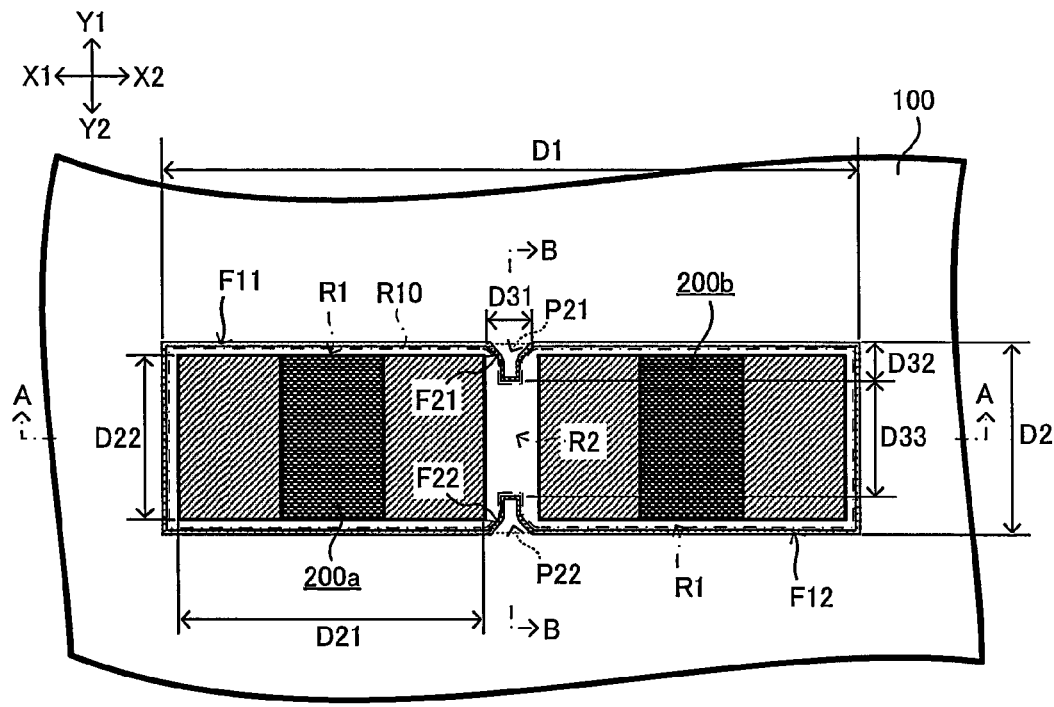
FIG. 2 is a plan view showing a state in which electronic components are accommodated in a cavity of a substrate (core substrate)
Figure 3:
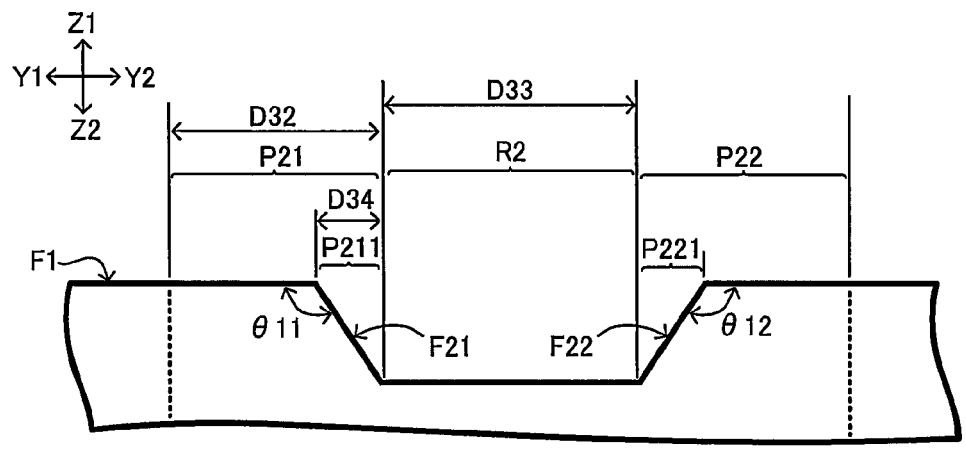
FIG. 3 is a cross-sectional view at the B-B line in FIG. 2.

FIG. 2 shows a state in which electronic components (200a, 200b) are accommodated in cavity (R10) of substrate 100 (core substrate). Here, FIG. 1 corresponds to a cross-sectional view at the A-A line in FIG. 2, and FIG. 3 is a cross-sectional view at the B-B line in FIG. 2.

As shown in FIG. 2, the opening shape at both ends of cavity (R10) (on the first-surface (F1) side and the second-surface (F2) side) is substantially rectangular. However, the opening shape is partially narrowed because of protrusions (protrusions (P21, P22)) formed on wall surfaces of cavity (R10) (opening portion).

The wall surfaces of cavity (R10) include non-protruding wall surfaces (F11, F12), end surface (F21) of protrusion (P21), and end surface (F22) of protrusion (P22). Protrusion (P21) and protrusion (P22) are formed on the opposing wall surfaces where cavity (R10) is divided substantially in two with their tips facing each other so that the protrusions make a pair. The width of cavity (R10) is reduced by protrusions (P21, P22), and the space in cavity (R10) is divided into a space to accommodate electronic component (200a) and another space to accommodate electronic component (200b). In the present embodiment, protrusions (P21, P22) are formed on the opposing wall surfaces where cavity (R10) (opening portion) is divided substantially equally (substantially in half, for example). Then, an electronic device (electronic component 200a or 200b) is accommodated in each space divided by protrusions (P21, P22).

In the present embodiment, electronic components (200a, 200b) are each surrounded by the wall surfaces of cavity (R10) (cut surfaces of substrate 100). Electronic component (200a) is surrounded by non-protruding wall surface (F11), end surface (F21) of protrusion (P21) and end surface (F22) of protrusion (P22). Electronic component (200b) is surrounded by non-protruding wall surface (F12), end surface (F21) of protrusion (P21) and end surface (F22) of protrusion (P22).

Figure 4A:
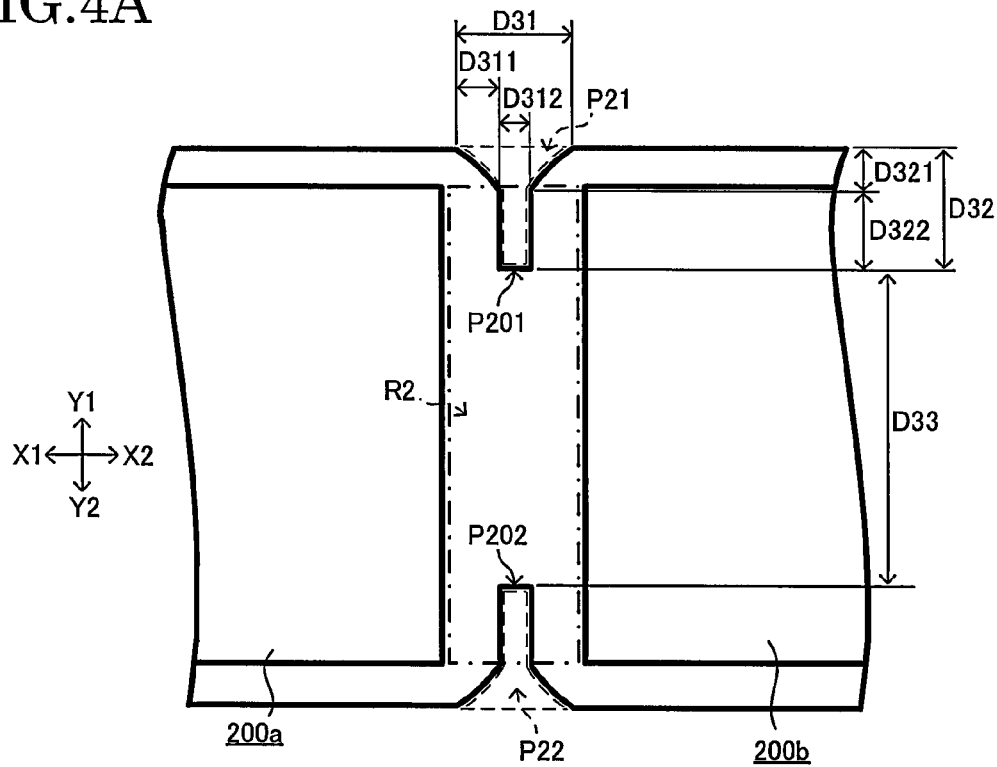
FIG. 4A is a magnified view showing a portion between adjacent electronic components.
Figure 4B:
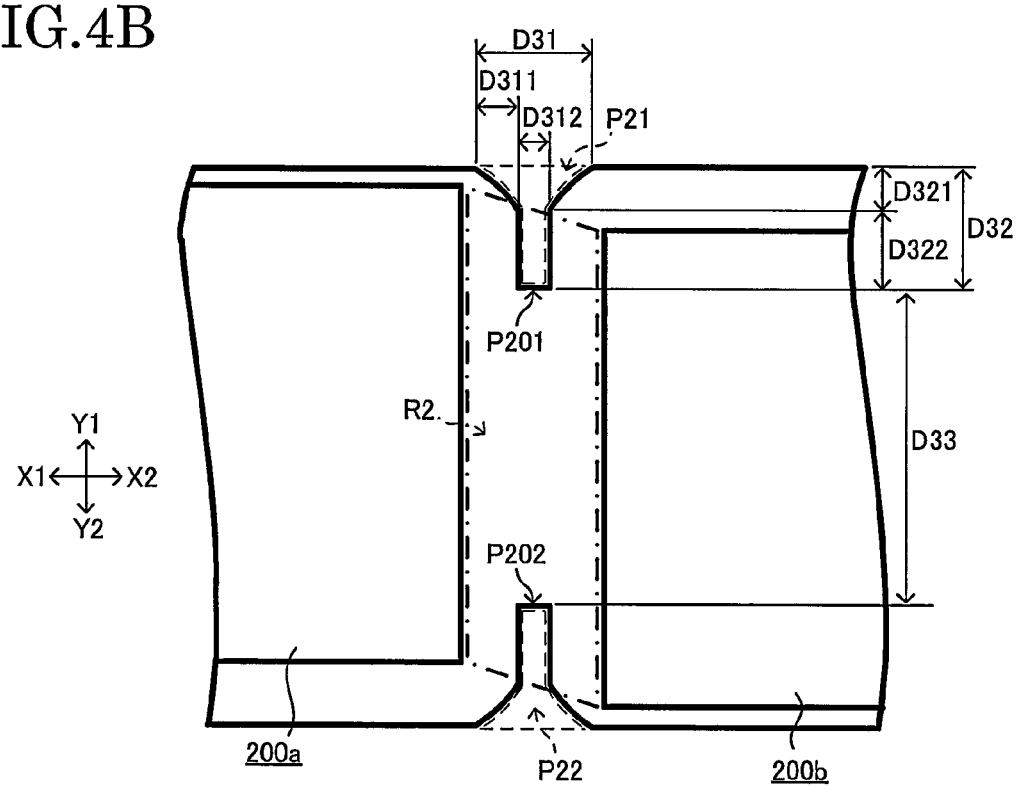
FIG. 4B is a view showing an example in which positions of adjacent electronic components are shifted.

In the present embodiment, tip (P201) of protrusion (P21) and tip (P202) of protrusion (P22) are inserted between adjacent electronic components (200a, 200b) (region (R2) indicated by a chain line in FIG. 4A) as shown in FIG. 4A. Accordingly, when force is exerted to bring electronic components (200a, 200b) closer to each other, movement in a direction that would bring electronic components (200a, 200b) closer is prevented by protrusions (P21, P22). Therefore, electronic component (200a) and electronic component (200b) seldom make contact. As a result, short circuiting (conduction) is suppressed from occurring between electronic components (200a, 200b) having side electrodes. Here, even if positions of electronic components (200a, 200b) are shifted in a direction Y as shown in FIG. 4B, for example, the same effects are achieved by tip (P201) of protrusion (P21) and tip (P202) of protrusion (P22) inserted between adjacent electronic components (200a, 200b) (region (R2) indicated by a chain line in FIG. 4B).

In the present embodiment, the planar shapes of protrusions (P21, P22) are each similar to that of a horn. Protrusions (P21, P22) each have a skirt portion, whose width becomes narrower toward the tip and its width reduction rate decreases as the width comes closer to the tip, along with a rectangular tip portion. Protrusions (P21, P22) with such a shape are excellent in terms of laser processing, component mountability and strength. However, the shape of protrusions (P21, P22) is not limited to the above, and may be determined freely (see later-described FIGS. 25~30).

End surface (F21) of protrusion (P21) and end surface (F22) of protrusion (P22) are each formed with a cut surface of substrate 100. In the present embodiment, end surfaces (F21, F22) are each a cut surface formed by a laser. However, that is not the only option, and end surfaces (F21, F22) may be cut surfaces formed by a die, for example. Alternatively, protrusions (P21, P22) may be prepared separately from substrate 100 (see later-described FIG. 37).

In the present embodiment, the wall surfaces of cavity (R10) (non-protruding wall surfaces (F11, F12), end surface (F21) of protrusion (P21) and end surface (F22) of protrusion (P22)) are tapered. In the present embodiment, angles ($\theta 11$, $\theta 12$) are obtuse between first surface (F1) of substrate 100 and the wall surfaces of cavity (R10) (tapered surfaces), as shown in FIG. 3. Accordingly, the wall surfaces of cavity (R10)

protrude further into cavity (R10) as the surfaces come closer to the second-surface (F2) side (Z2 side).

Figure 5A:
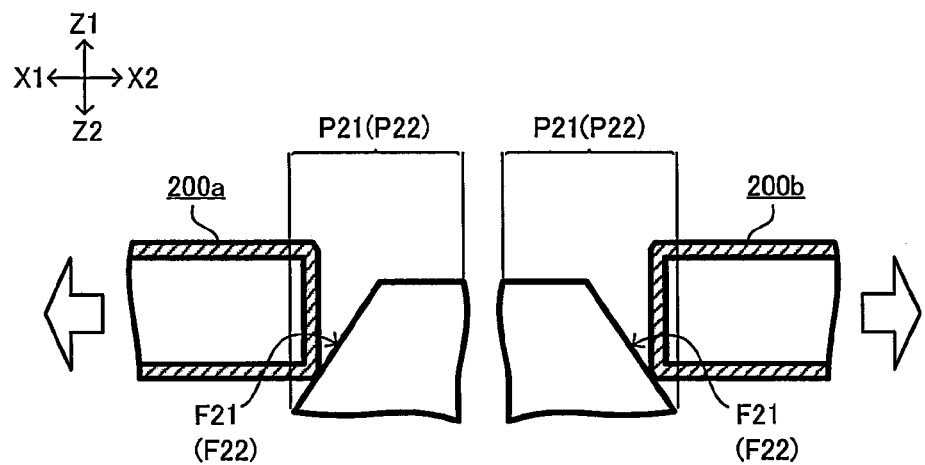
FIG. 5A is a view showing how movement of electronic components is prevented by a protrusion between adjacent electronic components.
Figure 5B:
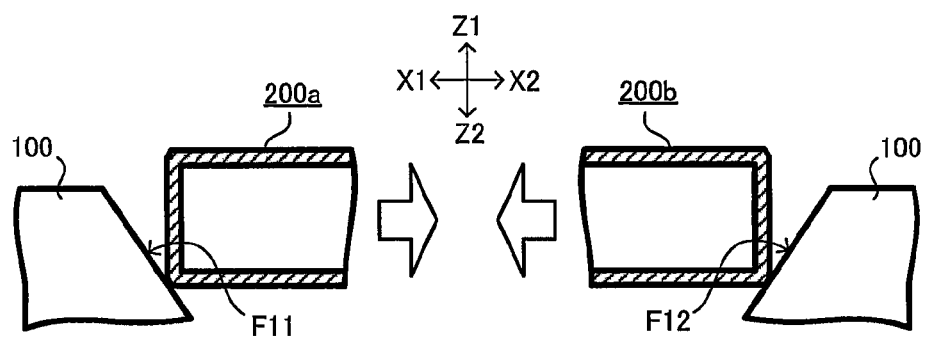
FIG. 5B is a view showing how movement of electronic components is prevented by wall surfaces of a cavity at the edge portions of the cavity.

The wall surfaces of cavity (R10) (cut surfaces of substrate 100) that surround electronic components (200a, 200b) (electronic devices) are all tapered. Accordingly, if electronic components (200a, 200b) move to be closer to each other, while such movement is prevented by protrusions (P21, P22) as shown in FIG. 5A, force is generated by the slope at end surface (F21) of protrusion (P21) or end surface (F22) of protrusion (P22) to work on electronic components (200a, 200b) in a direction to separate them. Also, if electronic components (200a, 200b) move to be out of cavity (R10), while such movement is prevented by non-protruding wall surfaces (F11, F12) as shown in FIG. 5B, force is generated by the slope at non-protruding wall surfaces (F11, F12) to work on electronic components (200a, 200b) in a direction toward the inside of cavity (R10). As a result, positions of electronic components (200a, 200b) seldom shift.

In addition, the opening area of an end (Z1 side) of cavity (R10) is greater than the opening area of the other end (Z2 side). Therefore, it is easier to place electronic components (200a, 200b) into cavity (R10) from the first-surface (F1) side (Z1 side) of substrate 100.

In the present embodiment, protrusion (P21) has edge portion (P211) positioned close to cavity (R10) (region R2) as shown in FIG. 3. Also, protrusion (P22) has edge portion (P221) positioned close to cavity (R10) (region R2). In the present embodiment, edge portions (P211, P221) are each tapered. However, that is not the only option, and edge portions (P211, P221) of protrusions (P21, P22) are not always required to be tapered (see FIGS. 31A, 31B).

Here, an example of the preferred value is shown for each measurement in FIGS. 2~4B.

Width (D1) of cavity (R10) in a longitudinal direction (direction X) is approximately 2160 μm, and width (D2) of cavity (R10) in a lateral direction (direction Y)) is approximately 580 μm.

Clearance is set at approximately 80 μm between electronic component (200a) or (200b) and cavity (R10). The distance between electronic component (200a) and electronic component (200b) (width of region R2) is set in an approximate range of 80~100 μm.

Width (D31) of protrusion (P21) is preferred to be in an approximate range of 80~100 μm. Especially preferred examples are: width (D31) of protrusion (P21) is approximately 80 μm, width (D311) of the skirt portion is approximately 30 μm, and width (D312) of the tip portion is approximately 20 μm. Protruding amount (D32) of protrusion (P21) is approximately 125 μm, approximately 40 μm of which is for length (D321) of the skirt portion and approximately 85 μm for length (D322) of the tip portion. In addition, width (D34) of edge portion (P212) is approximately 25 μm. Measurements of protrusion (P22) are respectively the same as those of protrusion (P21), for example. However, that is not the only option, and protrusion (P21) may have different measurements from those of protrusion (P22).

Angle ($\theta 11$) between first surface (F1) of substrate 100 and end surface (F21) of protrusion (P21) is approximately 125 degrees. Also, angle ($\theta 12$) between first surface (F1) of substrate 100 and end surface (F22) of protrusion (P22) is approximately 125 degrees.

Width (D33) is approximately 330 μm in the gap between tip (P201) of protrusion (P21) and tip (P202) of protrusion (P22). Width (D33) is preferred to be smaller than width (D22) of electronic component (200a) or (200b) in a lateral direction (direction Y). Having such measurements, since electronic component (200a) and electronic component (200b) are prevented from getting closer to each other by protrusions (P21, P22) positioned between them, electronic component (200a) and electronic component (200b) seldom make contact.

In the present embodiment, insulator (101a) is filled between electronic components (200a, 200b) in cavity (R10) and substrate 100 (region R1) as well as between electronic component (200a) and electronic component (200b) (region R2). In the present embodiment, insulator (101a) is made of insulative material (in particular, resin) that forms upper insulation layer 101 (in particular, resin insulation layer) (see FIG. 17). Insulator (101a) has a greater thermal expansion coefficient than any of substrate 100 or electronic components (200a, 200b). Insulator (101a) completely surrounds electronic components (200a, 200b). By doing so, electronic components (200a, 200b) are protected by insulator (101a) (resin), while being fixed in predetermined locations.

Insulation layer 101 is formed on first surface (F1) of substrate 100 and on third surfaces (F3) of electronic components (200a, 200b). Insulation layer 102 is formed on second surface (F2) of substrate 100 and on fourth surfaces (F4) of electronic components (200a, 200b). Insulation layer 101 covers one opening (on the first-surface (F1) side) of cavity (R10) (hole), and insulation layer 102 covers the other opening (on the second-surface (F2) side) of cavity (R10) (hole). Conductive layer 110 is formed on insulation layer 101, and conductive layer 120 is formed on insulation layer 102. In the present embodiment, conductive layers (110, 120) are outermost layers. However, that is not the only option, and more interlayer insulation layers and conductive layers may be further laminated.

Conductive layer 110 is the outermost conductive layer on the first-surface (F1) side, and conductive layer 120 is the outermost conductive layer on the second-surface (F2) side. Solder resists (11, 12) are formed respectively on conductive layers (110, 120). However, since opening portions (11a, 12a) are formed respectively in solder resists (11, 12), a predetermined spot of conductive layer 110 (a spot corresponding to opening portion 11a) is exposed without being covered by solder resist 11 and becomes pad (P11). Also, a predetermined spot of conductive layer 120 (a spot corresponding to opening portion (12a)) becomes pad (P12). Pad (P11) is an external connection terminal for an electrical connection with another wiring board, for example, and pad (P12) is an external connection terminal for mounting an electronic component, for example. However, the use of pads (P11, P12) is not limited to the above, and they may be used in any other way.

In the present embodiment, pads (P11, P12) have an anticorrosion layer made of, for example, Ni/Au film on their surfaces. Such an anticorrosion layer is made by electrolytic plating, sputtering or the like. Also, by conducting an OSP treatment, an anticorrosion layer made of organic preservative film may be formed. Such an anticorrosion layer is not always required, and may be omitted unless necessary.

In the present embodiment, pads (P11, P12) (external connection terminals) are positioned directly on electronic component (200a) or (200b) (electronic device). In wiring board 10 of the present embodiment, since positions of electronic devices built into the wiring board seldom shift, highly reliable electrical connections are easier to achieve between the electrodes of such electronic devices and external connection terminals formed directly on their tops through via conductors (such as via conductors (321b, 322b)).

Hole (313a) (via hole) is formed in insulation layer 101, and holes (321a, 322a, 323a) (via holes) are formed in insulation layer 102. By filling conductor (such as copper plating)

in holes (313a, 321a, 322a, 323a), conductors in the holes respectively become via conductors (313b, 321b, 322b, 323b) (filled conductors).

Via conductors (321b, 322b) are electrically connected respectively to electrodes (210, 220) of electronic component (200a) or (200b) from the second-surface (F2) side of substrate 100. In the present embodiment, electronic components (200a, 200b) are connected to via conductors from one side. In the following, such a structure is referred to as a single-sided via structure.

In the above single-sided via structure, electrodes (210, 220) of electronic component (200a) or (200b) and conductive layer 120 on insulation layer 102 are electrically connected to each other by via conductor (321b) or (322b). Such a structure has advantages for miniaturization because electrical connection is formed in inner layers.

Holes (313a, 323a) each reach through-hole conductor (300b), and via conductors (313b, 323b) are electrically connected to through-hole conductor (300b) from the first-surface (F1) side or second-surface (F2) side of substrate 100. Via conductors (313b, 323b) are each positioned directly on through-hole conductor (300b). Then, conductive layer 301 on first surface (F1) of substrate 100 and conductive layer 110 on insulation layer 101 are electrically connected to each other by via conductor (313b), and conductive layer 302 on second surface (F2) of substrate 100 and conductive layer 120 on insulation layer 102 are electrically connected to each other by via conductor (323b).

Via conductors (313b, 323b) and through-hole conductor (300b) are each a filled conductor in the present embodiment. They are stacked along a direction Z. Such a stacked structure is advantageous for miniaturization.

Figure 6:
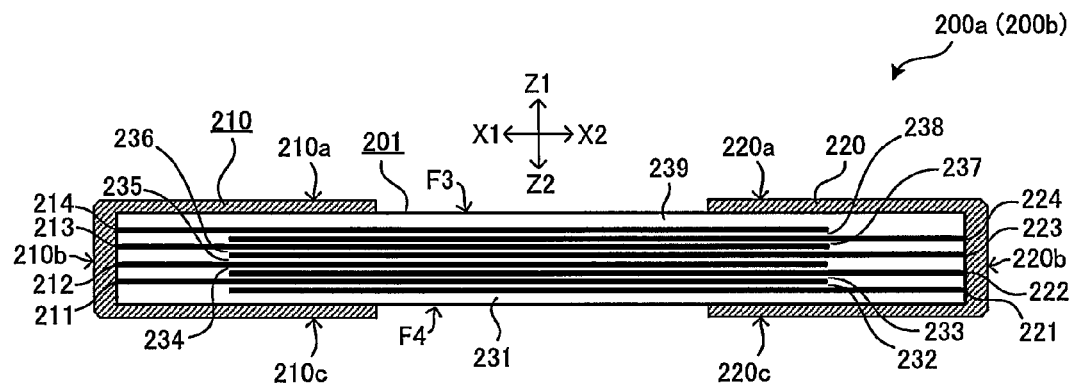
FIG. 6 is a cross-sectional view of a chip capacitor to be built into a wiring board according to the embodiment of the present invention.

Electronic components (200a, 200b) are each a chip capacitor. In particular, electronic components (200a, 200b) are each a chip-type MLCC (multilayer ceramic capacitor) as shown in FIG. 6, for example, and have capacitor body 201 and U-shaped electrodes (210, 220). Capacitor body 201 is formed by alternately laminating multiple dielectric layers (231~239) and multiple conductive layers (211~214, 221~224). Dielectric layers (231~239) are each made of ceramic, for example. Electrodes (210, 220) are formed on either side of capacitor body 201. Capacitor body 201 is covered by electrodes (210, 220) from the lower surface (a surface on the fourth-surface (F4) side) to a side surface and to the upper surface (a surface on the third-surface (F3) side). Here, electrode 210 is formed with upper portion (210a) partially covering the upper surface of capacitor body 201, side portion (210b) entirely covering a side surface of capacitor body 201, and lower portion (210c) partially covering the lower surface of capacitor body 201. Also, electrode 220 is formed with upper portion (220a) partially covering the upper surface of capacitor body 201, side portion (220b) entirely covering a side surface of capacitor body 201, and lower portion (220c) partially covering the lower surface of capacitor body 201.

Since the central portion of capacitor body 201 positioned between electrode 210 and electrode 220 is not covered by electrodes (210, 220), and dielectric layers (231, 239) (ceramic) are exposed as shown in FIG. 6, the strength is relatively low. However, when electronic components (200a, 200b) are mounted (built) in wiring board 10, the central portion of capacitor body 201 is covered by insulator (101a). Thus, capacitor body 201 is protected by insulator (101a) (resin).

Figure 7:
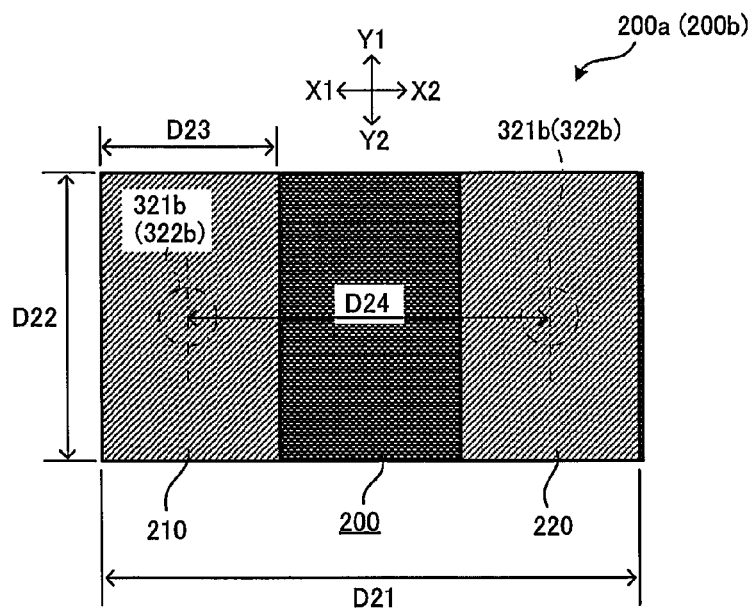
FIG. 7 is a plan view of a chip capacitor to be built into a wiring board according to the embodiment of the present invention.

In the following, an example of the preferred value is shown for each measurement in FIG. 7.

Width (D21) of electronic component (200a) in a longitudinal direction (direction X) is approximately 1000 μm, and width (D22) of electronic component (200a) in a lateral direction (direction Y) is approximately 500 μm. Width (D23) of upper portion (210a) or lower portion (210c) of electrode 210 is approximately 230 μm. The measurements of electrode 220 are the same as those of electrode 210, for example. The measurements of electronic component (200b) are the same as those of electronic component (200a), for example.

Pitch (D5) of via conductor (321b) or (322b) is approximately 770 μm, for example. In the present embodiment, substrate 100, insulation layers (101, 102), solder resists (11, 12) and electronic components (200a, 200b) are each shaped as a rectangle, for example. However, that is not the only option, and substrate 100 and others may be shaped in any other way.

The thickness of substrate 100 is approximately 100 μm, for example. Thicknesses of electronic components (200a, 200b) (thicknesses including electrodes) are each approximately 150 μm, for example. The thickness of wiring board 10 (thickness from solder resist 11 to solder resist 12) is approximately 290 μm, for example.

Substrate 100 is made of glass cloth (core material) impregnated with epoxy resin (hereinafter referred to as glass epoxy), for example. The core material has a lower thermal expansion coefficient than a main material (epoxy resin in the present embodiment). As for the core material, for example, inorganic material such as glass fiber (glass cloth, glass non-woven fabric or the like), aramid fiber (aramid non-woven fabric or the like) or silica filler is preferable. However, basically, the material for substrate 100 is not limited specifically. For example, instead of epoxy resin, the following may also be used: polyester resin, bismaleimide-triazine resin (BT resin), imide resin (polyimide), phenol resin, allyl polyphenylene ether resin (A-PPE resin) or the like. Substrate 100 may be formed with multiple layers made of different materials.

In the present embodiment, insulation layers (101, 102) are each made by impregnating core material with resin. If insulation layers (101, 102) are made of resin with core material, dents are seldom formed in insulation layers (101, 102), and ruptures are suppressed from occurring in conductive patterns formed on insulation layers (101, 102). Insulation layers (101, 102) are made of glass epoxy, for example. However, that is not the only option, and insulation layers (101, 102) may be made of resin without core material, for example. Also, basically, the material for insulation layers (101, 102) may be any type. For example, instead of epoxy resin, the following may also be used: polyester resin, bismaleimide-triazine resin (BT resin), imide resin (polyimide), phenol resin, allyl polyphenylene ether resin (A-PPE resin) or the like. Each insulation layer may be formed with multiple layers made of different materials.

Via conductors (321b, 322b, 313b, 323b) are each made of copper plating, for example. Such via conductors (321b) and the like are shaped, for example, in a tapered column (truncated cone) with a diameter that increases from substrate 100 (core substrate) or electronic components (200a, 200b) toward their respective upper layers. However, the shape of via conductors is not limited to the above, and any other shape may be employed.

Conductive layer 110 is formed with copper foil (lower layer) and copper plating (upper layer), and conductive layer 120 is formed with copper foil (lower layer) and copper plating (upper layer). Conductive layers (110, 120) include, for example, wiring to form an electrical circuit, a land, a planar pattern to enhance strength of wiring board 10, and the like.

As long as it is conductive, the material for each conductive layer and via conductor is selected freely, and it may be metallic or non-metallic. Each conductive layer and via conductor may be formed with multiple layers made of different materials.

In wiring board 10 of the present embodiment, protrusions (protrusions (P21, P22)) are formed on the wall surfaces of an opening portion (cavity R10), and the tips of such protrusions are inserted between adjacent electronic devices (electronic components (200a, 200b)) (see FIGS. 4A and 4B). Accordingly, when multiple electronic devices are accommodated in one opening portion, positions of electronic devices are suppressed from shifting. Also, by suppressing positional shifting of electronic devices, reliability is enhanced when built-in electronic devices in wiring board 10 are electronically connected (such as via connection). In addition, since electronic devices seldom contact each other in one opening portion, short circuiting is suppressed from occurring between electronic devices with side electrodes.

Wiring board 10 of the present embodiment has multiple built-in electronic devices. Since multiple electronic devices are accommodated in one opening portion of wiring board 10, the space required for accommodating multiple electronic devices is set smaller than when one electronic device is accommodated in one opening portion, thus making it advantageous for miniaturization. Accordingly, it is easier to make a CSP (chip size package) having highly integrated wiring. In addition, it is easier to make a wiring board with built-in electronic components having high-volume capacitor functions. It is also easier to achieve a CSP in which the impact from a voltage drop is lower during high-frequency operation.

Figure 8:
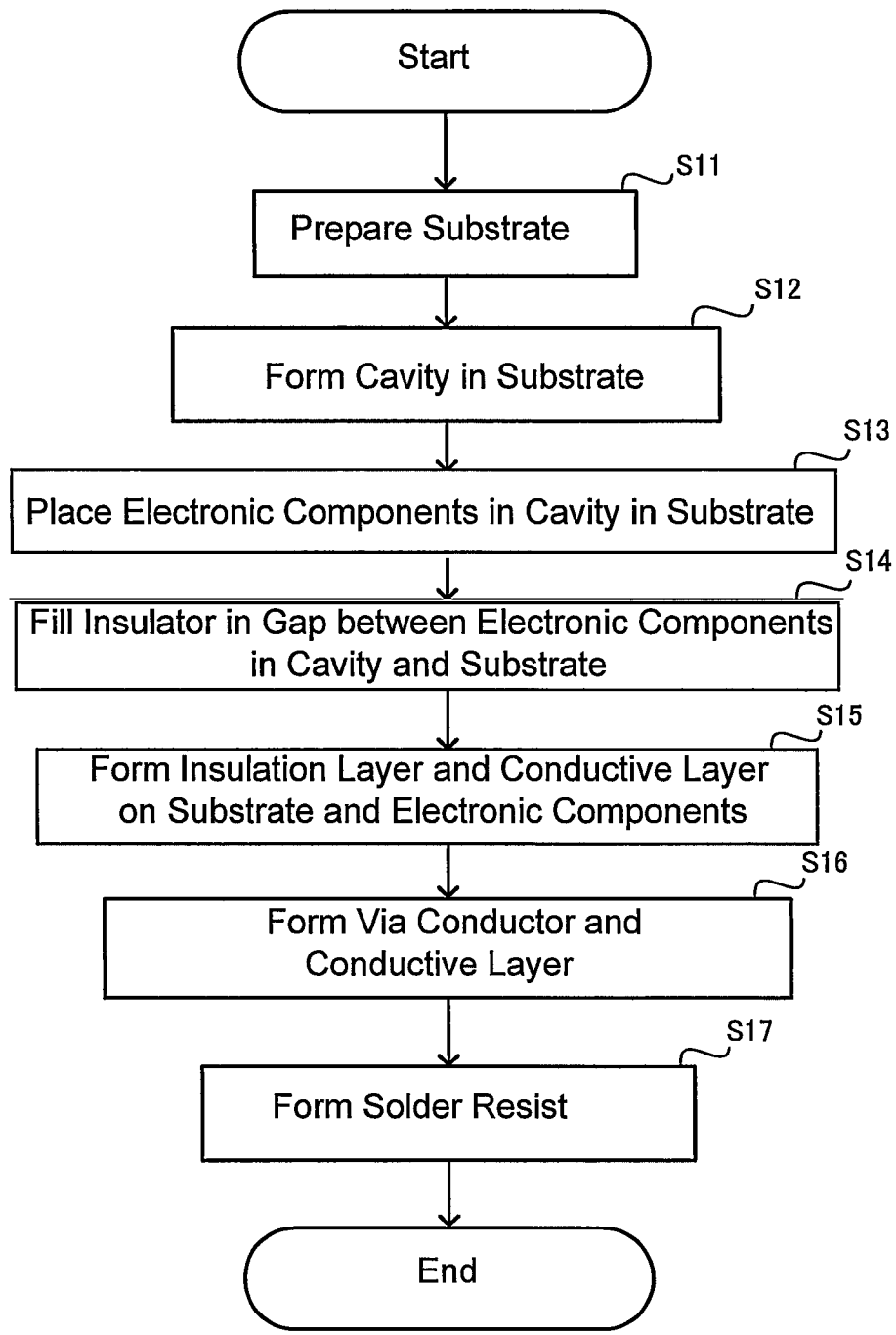
FIG. 8 is a flowchart showing a method for manufacturing a wiring board according to the embodiment of the present invention.

In the following, a method for manufacturing wiring board 10 is described with reference to FIG. 8 and others. FIG. 8 is a flowchart schematically showing the contents and steps of a method for manufacturing wiring board 10 according to the present embodiment.

In step (S11), a core section formed with substrate 100 and the like is formed.

Figure 9A:
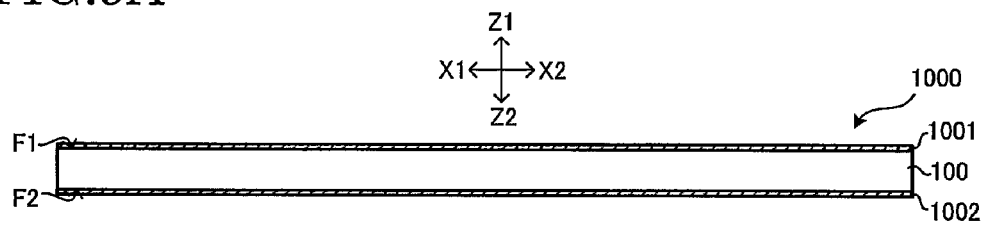
FIG. 9A is, in the manufacturing method shown in FIG. 8, a view to illustrate a first step for forming a core section.

Specifically, as shown in FIG. 9A, double-sided copper-clad laminate 1000 is prepared as a starting material. Double-sided copper-clad laminate 1000 is formed with substrate 100 (core substrate), copper foil 1001 formed on first surface (F1) of substrate 100, and copper foil 1002 formed on second surface (F2) of substrate 100. In the present embodiment, substrate 100 is made of glass epoxy, completely cured at this stage.

Figure 9B:
FIG. 9B is, in the manufacturing method shown in FIG. 8, a view to illustrate a second step for forming a core section.

Next, as shown in FIG. 9B, a $CO_2$ laser, for example, is used to irradiate double-sided copper-clad laminate 1000 from the first-surface (F1) side to form hole (1003a), and to irradiate double-sided copper-clad laminate 1000 from the second-surface (F2) side to form hole (1003b). Holes (1003a, 1003b) are formed at substantially the same location on the X-Y plane, and they are ultimately connected to form through hole (300a) which penetrates through double-sided copper-clad laminate 1000. The shape of through hole (300a) is similar to that of an hourglass, for example. The boundary of holes (1003a, 1003b) corresponds to narrowed portion (300c) (FIG. 1). Laser irradiation at the first surface (F1) and laser irradiation at the second surface (F2) may be conducted simultaneously or one surface at a time. After through hole (300a) is formed, desmearing on through hole (300a) is preferred to be conducted. Unwanted conduction (short circuiting) is suppressed by desmearing. In addition, to improve the absorption efficiency of laser light, a black-oxide treatment may be conducted on surfaces of copper foils (1001, 1002) prior to laser irradiation. Instead of using a laser, through hole (300a) may be formed using a drill, etching or the like. However, fine processing is made easier by processing with a laser.

Figure 9C:
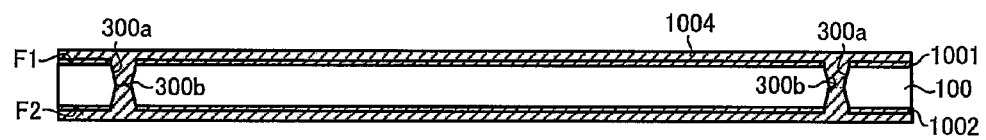
FIG. 9C is, in the manufacturing method shown in FIG. 8, a view to illustrate a third step for forming a core section.

Next, using a panel plating method, for example, copper plating 1004, for example, is formed on copper foils (1001, 1002) and in through hole (300a) as shown in FIG. 9C. In particular, electroless plating is first performed, followed by electrolytic plating in a plating solution using the electroless plated film as a seed layer so that plating 1004 is formed. Accordingly, plating 1004 is filled in through hole (300a), and through-hole conductor (300b) is formed.

Figure 9D:
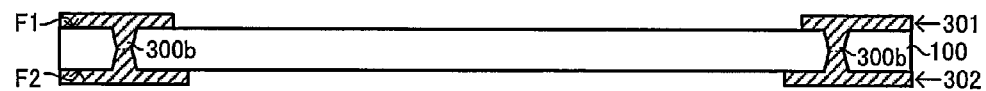
FIG. 9D is, in the manufacturing method shown in FIG. 8, a view to illustrate a fourth step for forming a core section.

Next, using etching resist and an etching solution, for example, each conductive layer formed on first surface (F1) and second surface (F2) of substrate 100 is patterned. Specifically, each conductive layer is covered by etching resist with a pattern corresponding to conductive layer 301 or 302, and portions of each conductive layer not covered by etching resist (portions exposed through opening portions of etching resist) are etched away. In doing so, conductive layers (301, 302) are respectively formed on first surface (F1) and second surface (F2) of substrate 100 as shown in FIG. 9D. As a result, the core section of wiring board 10 (FIG. 1) is completed. In the present embodiment, conductive layers (301, 302) each have a triple-layer structure of copper foil (lower layer), electroless copper plating (middle layer) and electrolytic copper plating (upper layer), for example.

Wet-type etching is not the only option, and it may be a dry type. Also, depending on requirements, it is considered preferable for surfaces of conductive layers (301, 302) to be roughened by etching or the like. In addition, alignment marks may be formed in conductive layer 301 or 302 to be used in later steps (such as steps for positioning electronic components (200a, 200b).

Figure 10:
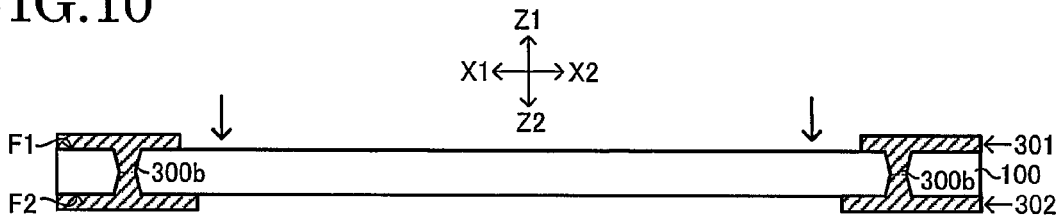
FIG. 10 is, in the manufacturing method shown in FIG. 8, a view to illustrate a step for forming a cavity.
Figure 11A:
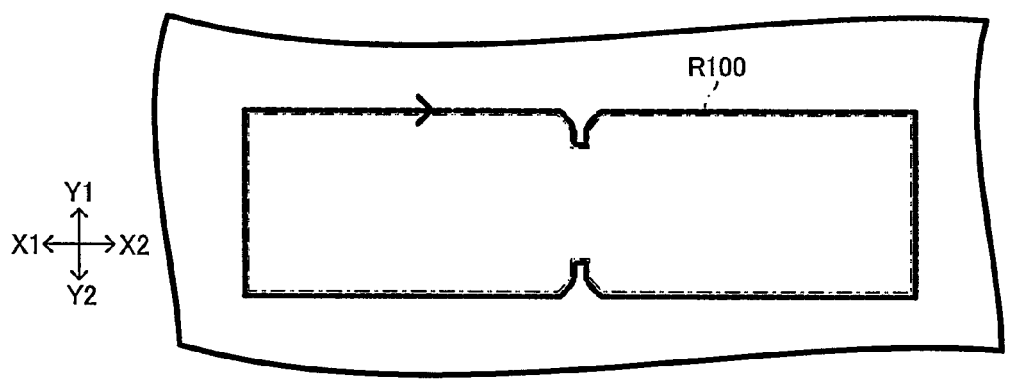
FIG. 11A is, in the manufacturing method shown in FIG. 8, a view to illustrate a first method for forming a cavity.

Next, in step (S12) in FIG. 8, cavity (R10) is formed by irradiating laser light at substrate 100 from its first-surface (F1) side as shown in FIG. 10, for example. Specifically, by irradiating laser light to draw the shape of cavity (R10) (see FIG. 2) as shown in FIG. 11A, for example, region (R100) which corresponds to cavity (R10) in substrate 100 is cut out from its surroundings. The laser irradiation angle is set to be substantially perpendicular to first surface (F1) of substrate 100, for example.

Figure 11B:
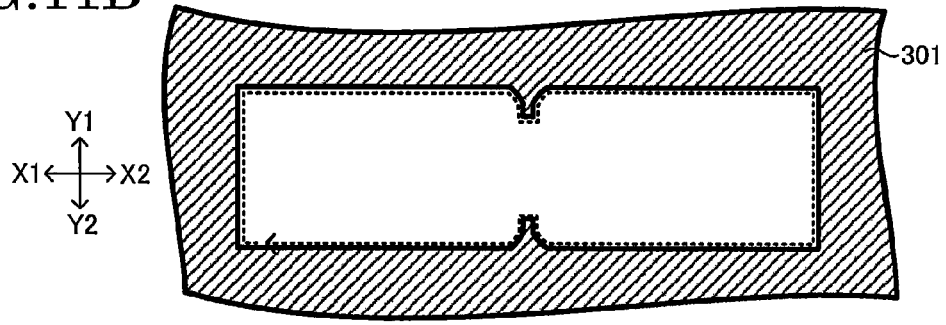
FIG. 11B is, in the manufacturing method shown in FIG. 8, a view to illustrate a second method for forming a cavity.
Figure 11C:
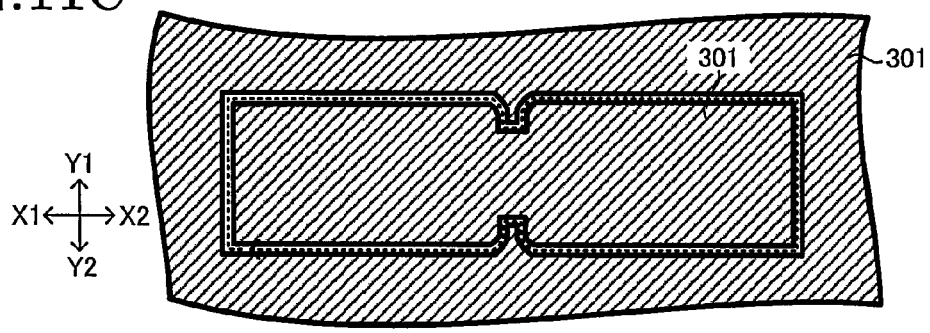
FIG. 11C is, in the manufacturing method shown in FIG. 8, a view to illustrate a third method for forming a cavity.

Prior to the above laser irradiation, conductive layer 301 on substrate 100 may be removed to correspond to the shape of cavity (R10) as shown in FIG. 11B, for example, or along the laser irradiation path as shown in FIG. 11C. In doing so, the position and shape of cavity (R10) are clear, making it easier to align laser irradiation.

Figure 12:
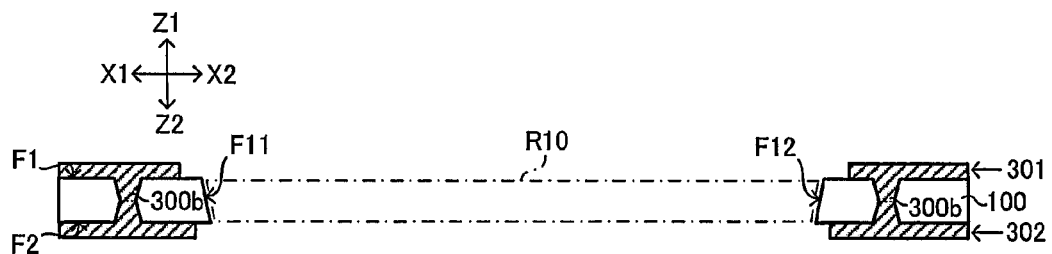
FIG. 12 is, in the manufacturing method shown in FIG. 8, a view showing a core substrate after a cavity is formed.

Cavity (R10) is formed by the above laser irradiation as shown in FIG. 12. In the present embodiment, by irradiating laser light on substrate 100 from the first-surface (F1) side, the amount processed by laser decreases toward the second-surface (F2) side, and cavity (R10) is formed with a width that becomes narrower as it goes from first surface (F1) toward second surface (F2). As a result, the cut surfaces of substrate 100 are tapered. In addition, in the present embodiment, protrusions (P21, P22) (see FIG. 2) are formed on the wall surfaces of cavity (R10) by moving laser light as shown in FIG. 11A. In the present embodiment, all the wall surfaces of cavity (R10) (including the end surfaces of protrusions (P21, P22) in addition to non-protruding wall surfaces (F11, F12)) are cut surfaces (tapered surfaces) of substrate 100.

Cavity (R10) formed as above becomes accommodation space for electronic components (200a, 200b). In the present embodiment, since a laser is used to form cavity (R10), it is easy to obtain cavity (R10) which has tapered wall surfaces.

However, methods for forming cavity (R10) are not limited to using a laser, and a die may also be used, for example.

Next, in step (S13) of FIG. 8, electronic components (200a, 200b) are positioned in cavity (R10) of substrate 100.

Figure 13:
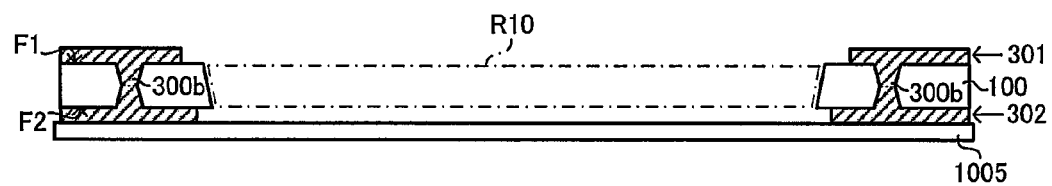
FIG. 13 is, in the manufacturing method shown in FIG. 8, a view to illustrate a step for attaching a carrier to the core substrate with a cavity.

Specifically, carrier 1005 made of PET (polyethylene terephthalate), for example, is arranged on one side of substrate 100 (second surface (F2), for example) as shown in FIG. 13. Accordingly, one opening of cavity (R10) (hole) is covered by carrier 1005. In the present embodiment, carrier 1005 is made of an adhesive sheet (such as a tape), and its adhesive side faces substrate 100. Carrier 1005 is adhered to substrate 100 by lamination, for example.

Figure 14:
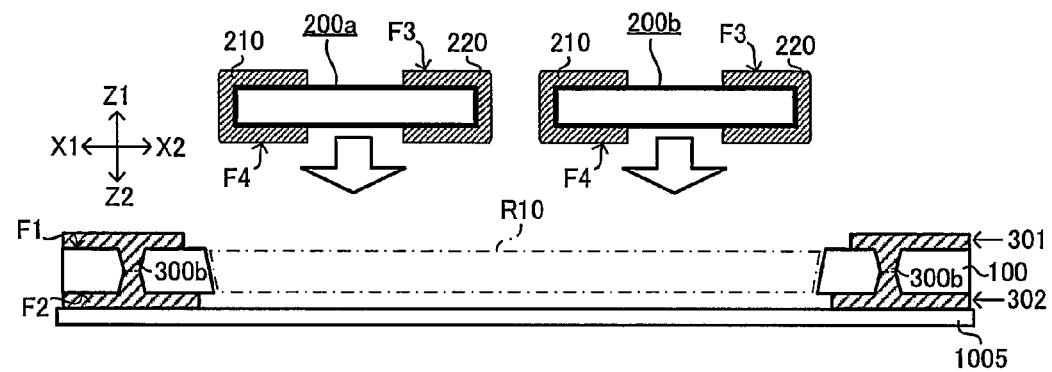
FIG. 14 is, in the manufacturing method shown in FIG. 8, a view to illustrate a step for positioning multiple electronic components in the cavity.
Figure 15:
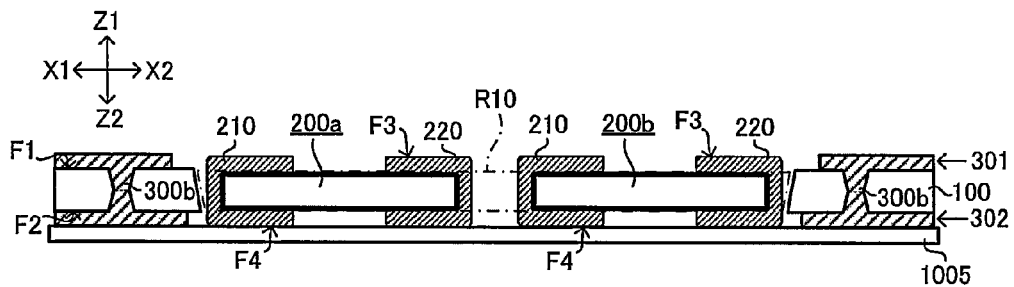
FIG. 15 is, in the manufacturing method shown in FIG. 8, a view showing a state where multiple electronic components are positioned in the cavity.

Next, as shown in FIG. 14, electronic components (200a, 200b) are placed into cavity (R10) from the side (Z1 side) opposite the covered opening of cavity (R10) (hole). Electronic components (200a, 200b) are each placed into cavity (R10) by a mounter, for example. For example, electronic components (200a, 200b) are each held on a vacuum chuck or the like, transported to the area above cavity (R10) (Z1 side), lowered vertically from that area, and then put into cavity (R10). Accordingly, electronic components (200a, 200b) are positioned on carrier 1005 (adhesive sheet) as shown in FIG. 15.

Figure 16:
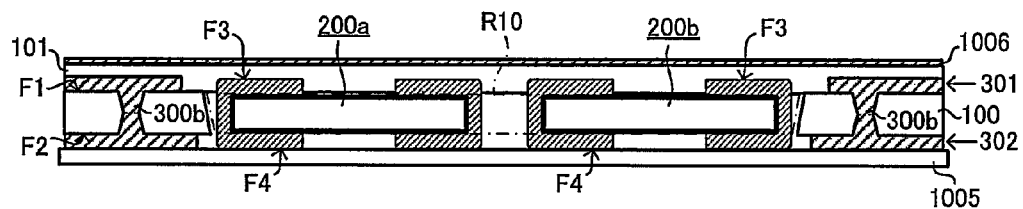
FIG. 16 is, in the manufacturing method shown in FIG. 8, a view to illustrate a step for forming a first interlayer insulation layer and a first copper foil on the insulative substrate and on the electronic components.
Figure 17:
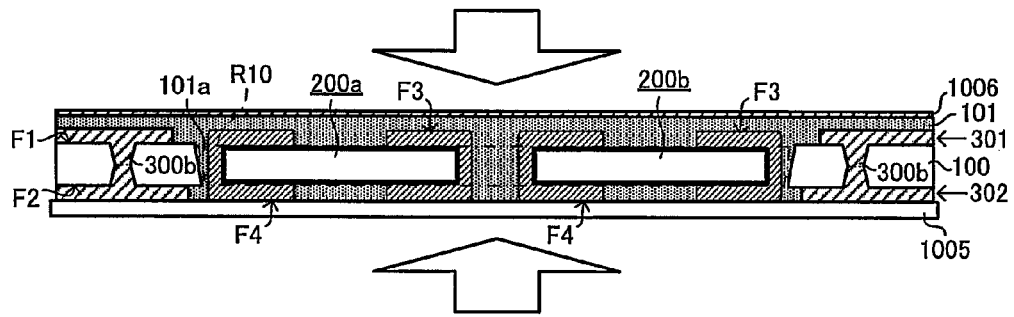
FIG. 17 is, in the manufacturing method shown in FIG. 8, a view to illustrate a pressing step.
Figure 18:
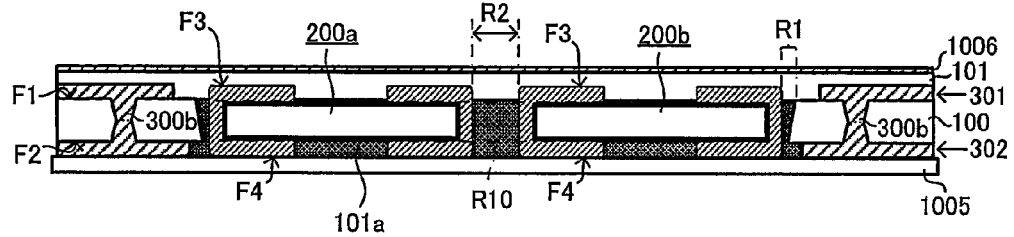
FIG. 18 is a view subsequent to the pressing step in FIG. 17.
Figure 19:
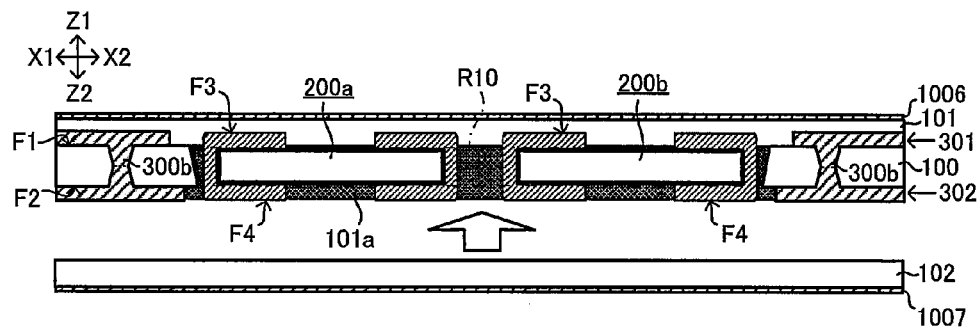
FIG. 19 is, in the manufacturing method shown in FIG. 8, a view to illustrate a step for forming a second interlayer insulation layer and a second copper foil on the insulative substrate and on the electronic components after the carrier is removed.

Next, in step (S14) in FIG. 8, semicured insulation layer 101 is formed on first surface (F1) of substrate 100 and on third surfaces (F3) of electronic components (200a, 200b) positioned on the side (Z1 side) opposite the covered opening of cavity (R10) (hole) as shown in FIG. 16. In addition, copper foil 1006 is formed on insulation layer 101. Insulation layer 101 is made of thermosetting epoxy-resin prepreg, for example. Then, by pressing semicured insulation layer 101 as shown in FIG. 17, resin is flowed out of insulation layer 101 into cavity (R10). Accordingly, insulator (101a) (resin from insulation layer 101) is filled between electronic components (200a, 200b) in cavity (R10) and substrate 100 (region R1) and between electronic component (200a) and electronic component (200b) (region R2) as shown in FIG. 18.

After insulator (101a) is filled in cavity (R10), the filled resin (insulator 101a) and electronic components (200a, 200b) are preliminarily adhered. Specifically, the filled resin is heated to gain retention power to a degree that it can support electronic components (200a, 200b). In doing so, electronic components (200a, 200b) supported by carrier 1005 are supported by the filled resin. Then, carrier 1005 is removed.

At this stage, insulator (101a) (filled resin) and insulation layer 101 are only semicured, and are not completely cured. However, that is not the only option, and insulator (101a) and insulation layer 101 may be completely cured at this stage, for example.

Next, in step (S15) in FIG. 8, the second-surface (F2) side of substrate 100 is built up.

Specifically, insulation layer 102 and copper foil 1007 are formed on second surface (F2) of substrate 100. Electrodes (210, 220) of electronic components (200a, 200b) are each covered by insulation layer 102. While it is prepreg, insulation layer 102 is adhered to substrate 100 by pressing, for example, and insulation layers (101, 102) are each cured thermally. In the present embodiment, the resin filled in cavity (R10) is cured after the removal of the adhesive sheet (carrier 1005). Thus, insulation layers (101, 102) can be simultaneously cured. Then, by simultaneously curing insulation layers (101, 102) on both surfaces, warping in substrate 100 is suppressed, making it easier to make substrate 100 thinner.

Next, in step (S16) in FIG. 8, via conductors and conductive layers are formed.

Figure 20:
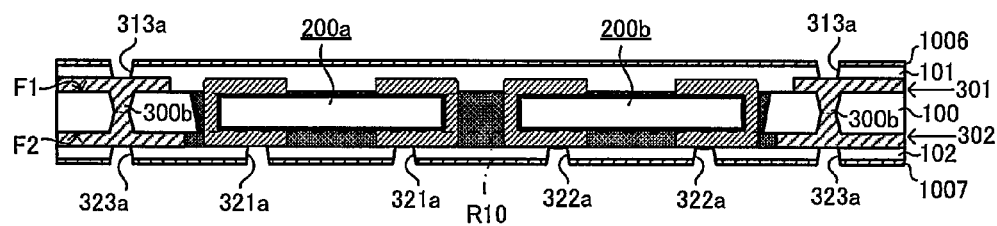
FIG. 20 is, in the manufacturing method shown in FIG. 8, a view to illustrate a first step for forming conductive layers on the first and second interlayer insulation layers and for electrically connecting each conductive layer and electrodes of the electronic components.

Specifically, as shown in FIG. 20, a laser is used, for example, to form hole (313a) (via hole) in insulation layer 101 and copper foil 1006, and holes (321a~323a) (each a via hole) in insulation layer 102 and copper foil 1007. Hole (313a) penetrates through copper foil 1006 and insulation layer 101, and holes (321a~323a) each penetrate through copper foil 1007 and insulation layer 102. Then, hole (321a) reaches electrode 210 or 220 of electronic component (200a), and hole (322a) reaches electrode 210 or 220 of electronic component (200b). In addition, holes (313a, 323a) respectively reach conductive layers (301, 302) directly on through-hole conductor (300b). Then, desmearing is performed if required.

Figure 21:
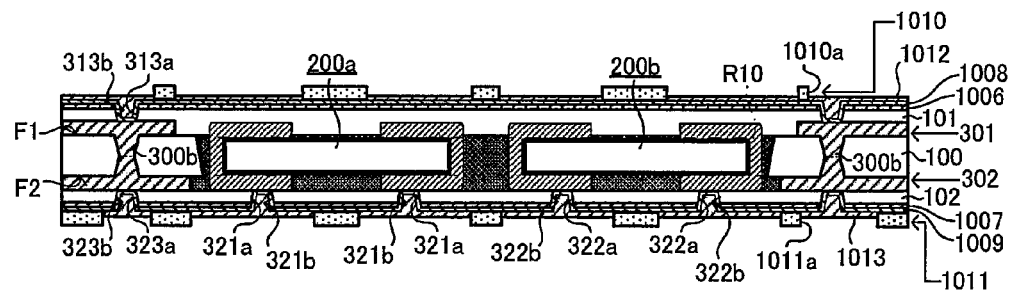
FIG. 21 is a view to illustrate a second step subsequent to the step in FIG. 20.

Next, using a chemical plating method, for example, electroless copper-plated films (1008, 1009), for example, are formed on copper foils (1006, 1007) and in holes (313a, 321a~323a) (see FIG. 21). Prior to electroless plating, a catalyst made of palladium or the like may be adsorbed on surfaces of insulation layers (101, 102) through immersion, for example.

Figure 22:
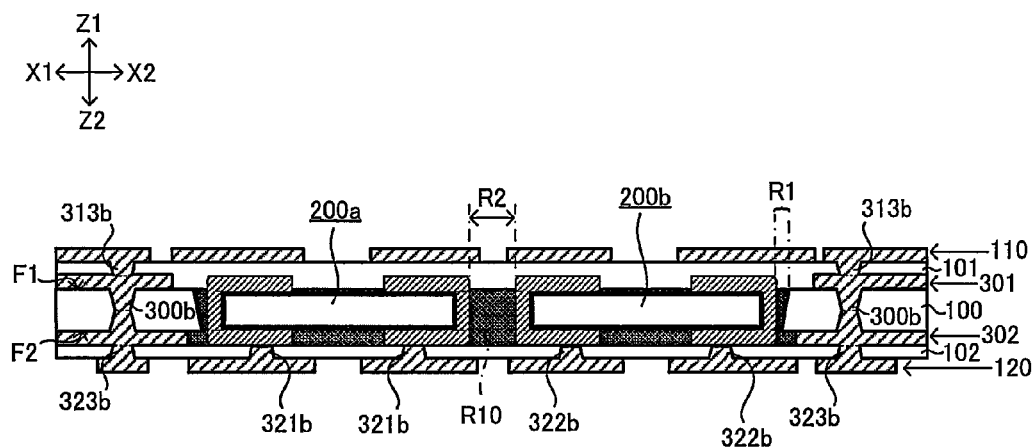
FIG. 22 is a view to illustrate a third step subsequent to the step in FIG. 21.

Next, using lithographic technology or printing, plating resist 1010 with opening portion (1010a) is formed on the first-surface (F1) side main surface (on electroless plated film 1008), and plating resist 1011 with opening portion (1011a) is formed on the second-surface (F2) side main surface (on electroless plated film 1009) (see FIG. 21). Opening portions (1010a, 1011a) respectively have a pattern corresponding to conductive layers (110, 120) (FIG. 22).

Next, as shown in FIG. 21, using a pattern plating method, for example, electrolytic copper platings (1012, 1013) are formed respectively in opening portions (1010a, 1011a) of plating resists (1010, 1011). Specifically, copper as the plating material is connected to the anode, and electroless plated films (1008, 1009) as the material to be plated are connected to the cathode, and the substrate is immersed in a plating solution. Then, a DC voltage is applied between the poles to flow current so that copper is deposited on surfaces of electroless plated films (1008, 1009). Accordingly, electroless plated films (1008, 1009) and electrolytic platings (1012, 1013) are each filled in holes (313a, 321a~323a), and via conductors (313b, 321b~323b) made of copper plating, for example, are formed.

Then, using a predetermined removal solution, for example, plating resists (1010, 1011) are removed, and unnecessary portions of electroless plated films (1008, 1009) and copper foils (1006, 1007) are removed. Accordingly, conductive layers (110, 120) are formed as shown in FIG. 22.

A seed layer for electrolytic plating is not limited to electroless plated film, and sputtered film or the like may also be used as a seed layer instead of electroless plated films (1008, 1009).

Then, in step (S17) in FIG. 8, solder resist 11 with opening portion (11a) and solder resist 12 with opening portion (12a) are formed respectively on insulation layers (101, 102) (see FIG. 1). Conductive layers (110, 120) are covered by solder resists (11, 12) except for predetermined portions (such as pads (P11, P12)) positioned at opening portions (11a, 12a). Solder resists (11, 12) are formed by, for example, screen printing, spray coating, roll coating, lamination and the like.

Next, an anticorrosion layer made of Ni/Au film, for example, is formed on conductive layers (110, 120), in particular, on surfaces of pads (P11, P12) that are not covered by solder resists (11, 12) (see FIG. 1), by electrolytic plating, sputtering or the like. Alternatively, an anticorrosion layer made of organic protective film may be formed by an OSP treatment.

Accordingly, a buildup section formed with insulation layer 101 and conductive layer 110 is formed on first surface (F1) of substrate 100, and a buildup section formed with insulation layer 102 and conductive layer 120 is formed on second surface (F2) of substrate 100. As a result, wiring board 10 of the present embodiment (FIG. 1) is completed. Then, electrical testing (to check capacity, insulation or the like) is conducted on electronic components (200a, 200b) if required.

The manufacturing method of the present embodiment is suitable for manufacturing wiring board 10. An excellent wiring board 10 is obtained at low cost using such a manufacturing method.

Figure 23:
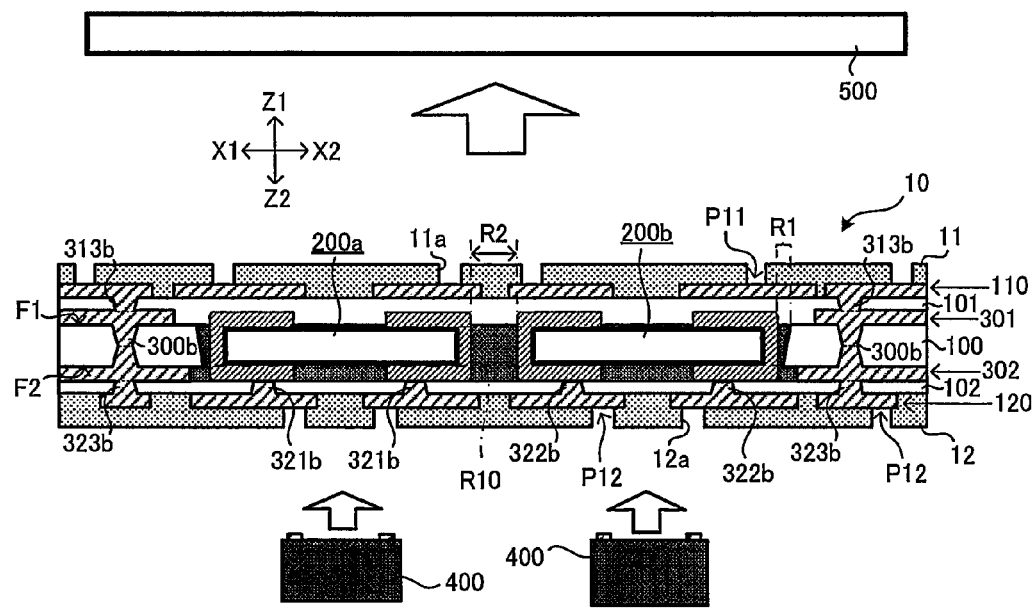
FIG. 23 is a view showing a state in which electronic components are mounted on a surface of a wiring board according to the embodiment of the present invention.

Wiring board 10 of the present embodiment may be electrically connected to other electronic components or other wiring boards, for example. Electronic component 400 (such as an IC chip) may be mounted on pad (P12) of wiring board 10 using solder or the like as shown in FIG. 23, for example. Also, wiring board 10 may be mounted on another wiring board 500 (such as a motherboard) through pad (P11). Wiring board 10 of the present embodiment may be used as a circuit board of a cell phone, for example.

So far, a wiring board and its manufacturing method are described according to the embodiment of the present invention. However, the present invention is not limited to the above embodiment. For example, the present embodiment may be modified as follows.

Figure 24:
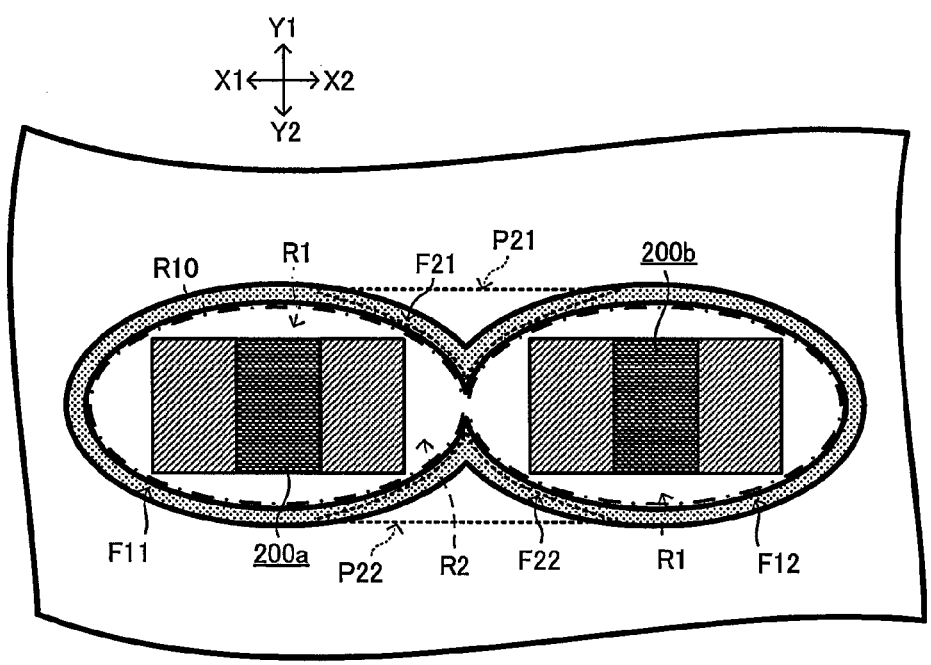
FIG. 24 is a view showing another shape of the cavity in a wiring board according to the embodiment of the present invention.

Shapes of electronic components (200a, 200b) and cavity (R10) are not limited specifically. For example, as shown in FIG. 24, the opening shape of cavity (R10) may be substantially an ellipse. The planar shape of electronic components (200a, 200b) and the opening shape of cavity (R10) may be substantially a circle (substantially a perfect circle). Alternatively, other than substantially a rectangle, their shapes may be substantially a polygon such as substantially a square, substantially a regular hexagon, substantially a regular octagon and the like. The shapes of angles of polygons are not limited specifically, and they may be, for example, substantially right, acute or obtuse, or even roundish.

The shape of protrusions (P21, P22) may be determined freely.

Figure 25:
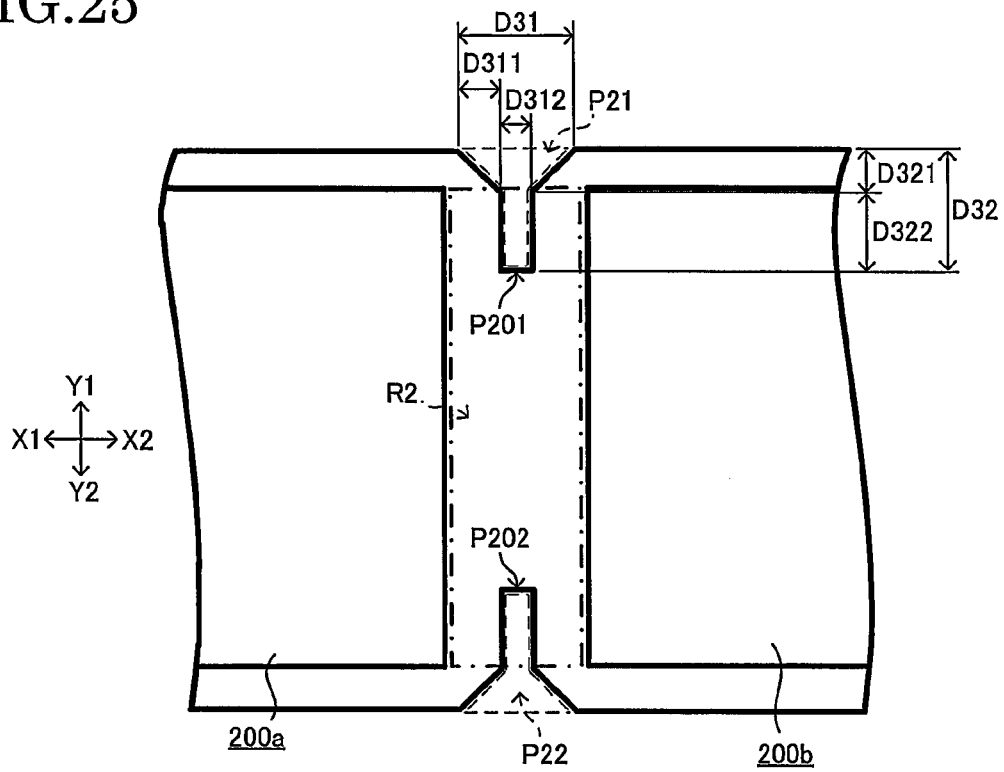
FIG. 25 is, in another embodiment of the present invention, a view showing a first planar shape of protrusions in a wiring board.

For example, as shown in FIG. 25, the planar shape of protrusions (P21, P22) may be similar to that of a flask. In the example shown in FIG. 25, protrusions (P21, P22) are each formed with a skirt portion, whose width becomes narrower at a constant rate toward the tip along, and a rectangular tip portion. Protrusions (P21, P22) with such a shape are excellent in terms of laser processing and strength. Preferred examples are set as follows: width (D31) of protrusion (P21) at approximately 80 μm; width (D311) of the skirt portion at approximately 30 μm; width (D312) of the tip portion at approximately 20 μm; and protruding amount (D32) of protrusion (P21) at approximately 125 μm. Of the protruding amount, approximately 40 μm is for length (D321) of the skirt portion and approximately 85 μm is for length (D322) of the tip portion. Each measurement of protrusion (P22) is the same as that of protrusion (P21), for example.

Figure 26:
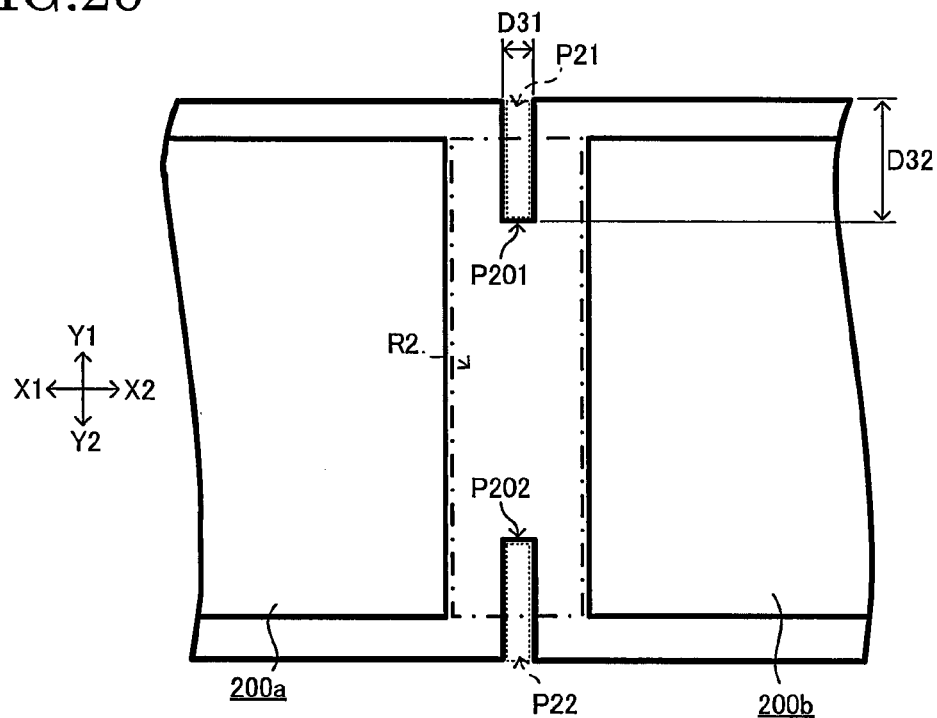
FIG. 26 is, in yet another embodiment of the present invention, a view showing a second planar shape of protrusions in a wiring board.

As shown in FIG. 26, for example, the planar shape of protrusions (P21, P22) may have four sides (such as a rectangle). In the example in FIG. 26, protrusions (P21, P22) are each formed with a skirt portion, whose width becomes narrower at a constant rate toward the tip, and a rectangular tip portion. Protrusions (P21, P22) with such a shape are excellent in terms of laser processing and component mountability. Preferred examples are set as follows: width (D31) of protrusion (P21) at approximately 20 μm; and protruding amount (D32) of protrusion (P21) at approximately 290 μm. Other preferred examples are set as follows: width (D31) of protrusion (P21) at approximately 20 μm; and protruding amount (D32) of protrusion (P21) at approximately 125 μm. Each measurement of protrusion (P22) is the same as that of protrusion (P21), for example.

Figure 27:
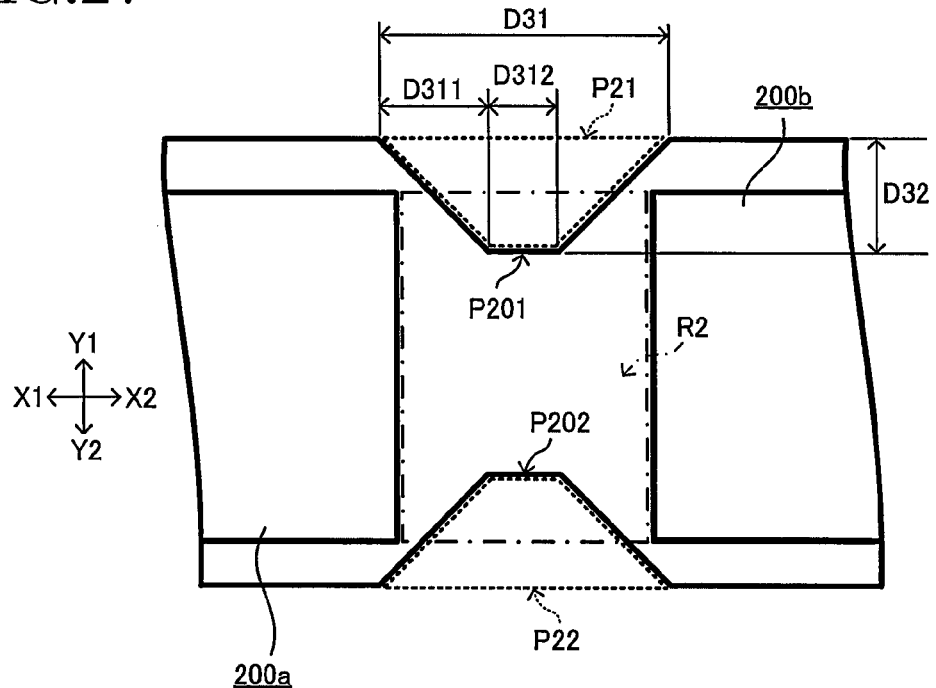
FIG. 27 is, in yet another embodiment of the present invention, a view showing a third planar shape of protrusions in a wiring board.

As shown in FIG. 27, for example, the planar shape of protrusions (P21, P22) may be similar to that of a wedge (such as a trapezoid). In the example in FIG. 27, protrusions (P21, P22) each have a width that decreases at a constant rate along the entire length toward the tip. Protrusions (P21, P22) with such a shape are excellent in terms of laser processing and strength. Preferred examples are set as follows: width (D31) of protrusion (P21) at approximately 40 μm; width (D311) of the skirt portion at approximately 10 μm; width (D312) of the tip portion at approximately 20 μm; and protruding amount (D32) of protrusion (P21) at approximately 125 μm. Other preferred examples are set as follows: width (D31) of protrusion (P21) at approximately 60 μm; width (D311) of the skirt portion at approximately 20 μm; width (D312) of the tip portion at approximately 20 μm; and protruding amount (D32) of protrusion (P21) at approximately 125 μm. Yet other preferred examples are set as follows: width (D31) of protrusion (P21) at approximately 80 μm; width (D311) of the skirt portion at approximately 30 μm; width (D312) of the tip portion at approximately 20 μm; and protruding amount (D32) of protrusion (P21) at approximately 125 μm. Each measurement of protrusion (P22) is the same as that of protrusion (P21), for example.

Figure 28:
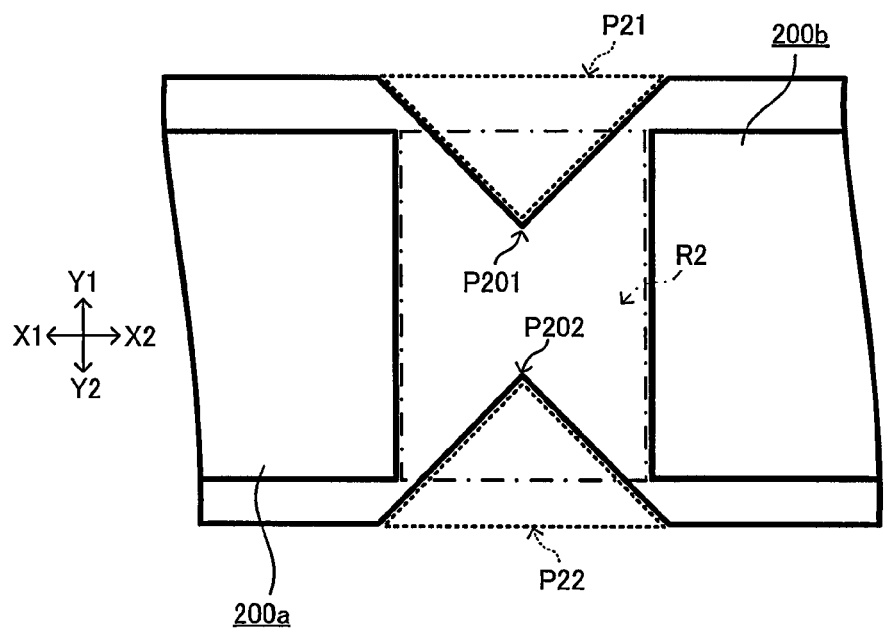
FIG. 28 is, in yet another embodiment of the present invention, a view showing a fourth planar shape of protrusions in a wiring board.

In the example in FIG. 27, protrusions (P21, P22) each have a width that decreases at a constant rate. However, that is not the only option, and the width reduction rate may become smaller toward the tip. Alternatively, as shown in FIG. 28, tips (P201, P202) may be pointed. In the example shown in FIG. 28, the planar shape of protrusions (P21, P22) is triangular.

Figure 29:
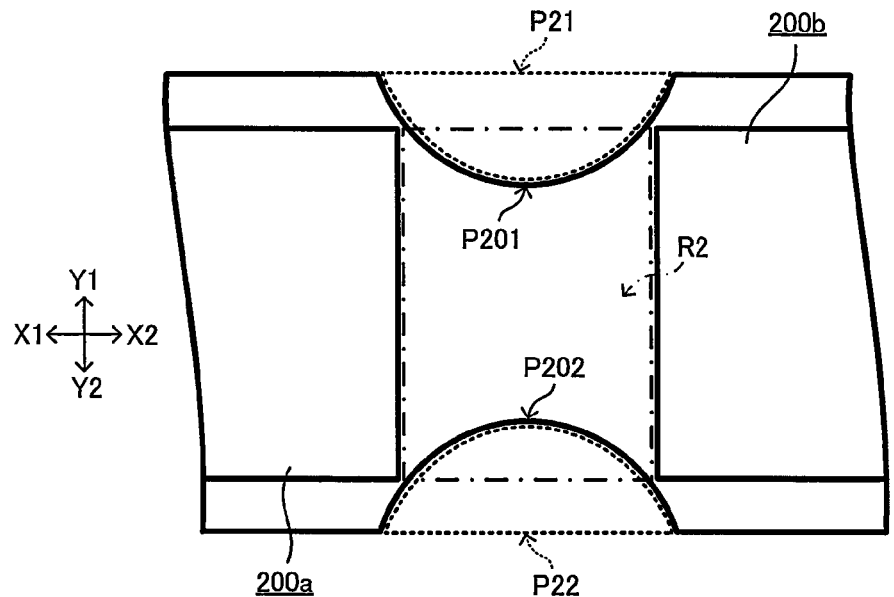
FIG. 29 is, in yet another embodiment of the present invention, a view showing a fifth planar shape of protrusions in a wiring board.
Figure 30:
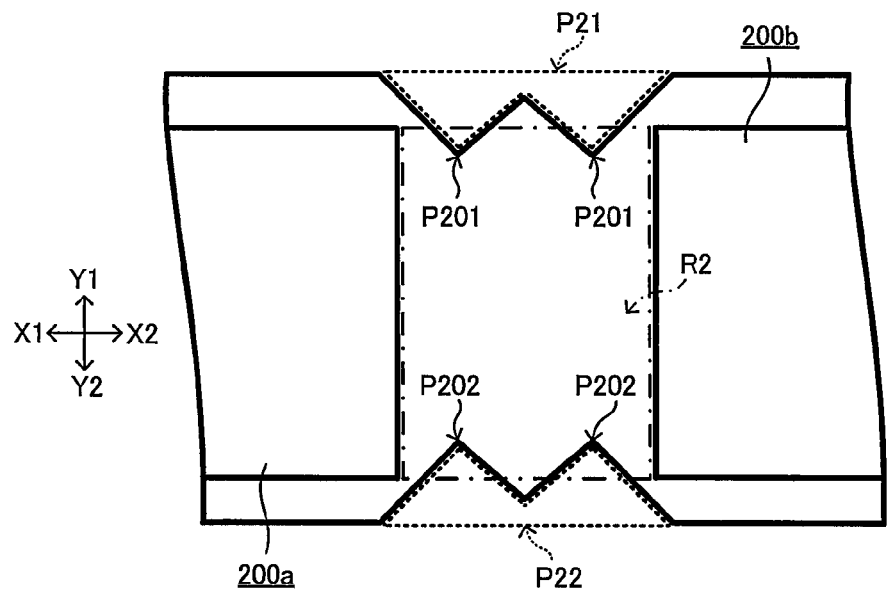
FIG. 30 is, in yet another embodiment of the present invention, a view showing a sixth planar shape of protrusions in a wiring board.

As shown in FIG. 29, for example, the planar shape of protrusions (P21, P22) may be substantially semicircular, and their respective tips (P201, P202) may be roundish. Alternatively, as shown in FIG. 30, for example, the planar shape of protrusions (P21, P22) may be substantially W-shaped, and protrusions (P21, P22) may have multiple tips (P201, P202) respectively.

Figure 31A:
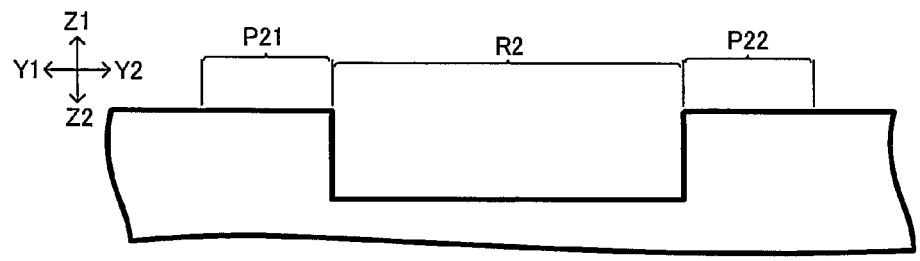
FIG. 31A is, in yet another embodiment of the present invention, a view showing a first cross-sectional shape of a protrusion in a wiring board.
Figure 31B:
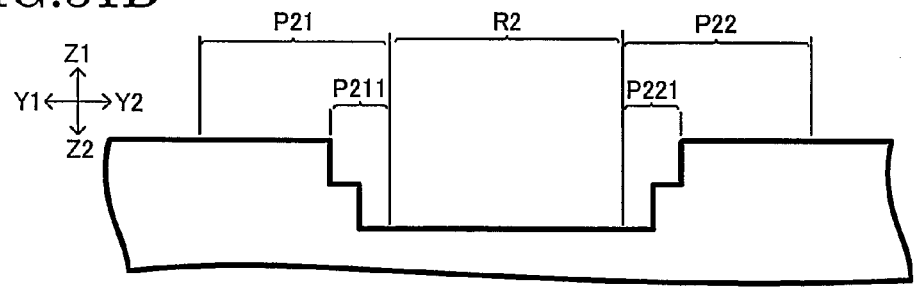
FIG. 31B is, in yet another embodiment of the present invention, a view showing a second cross-sectional shape of a protrusion in a wiring board.
Figure 31C:
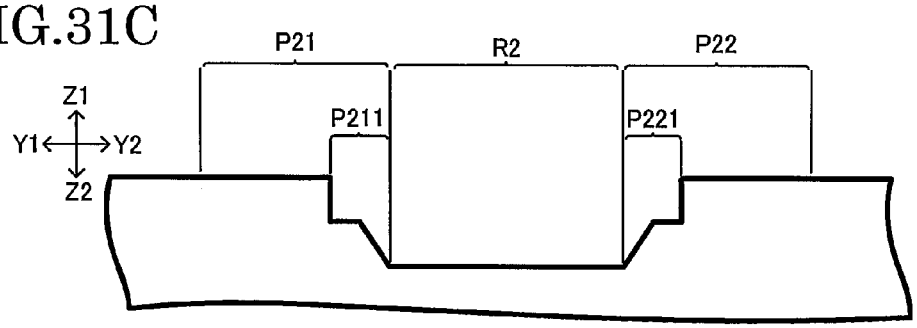
FIG. 31C is, in yet another embodiment of the present invention, a view showing a third cross-sectional shape of a protrusion in a wiring board.
Figure 31D:
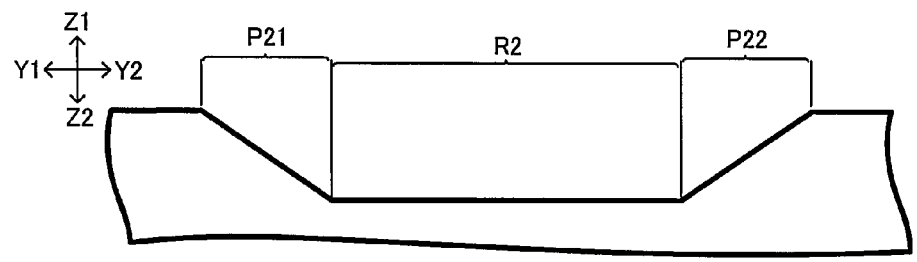
FIG. 31D is, in yet another embodiment of the present invention, a view showing a fourth cross-sectional shape of a protrusion in a wiring board.

As shown in FIG. 31A, for example, edge portion (P211) of protrusion (P21) and edge portion (P221) of protrusion (P22) are not always required to be tapered. Alternatively, as shown in FIG. 31B, for example, edge portion (P211) of protrusion (P21) and edge portion (P221) of protrusion (P22) may have step portions. Yet alternatively, as shown in FIG. 31C, for example, edge portion (P211) of protrusion (P21) and edge portion (P221) of protrusion (P22) may have step portions, part of which (lower step, for example) may be tapered. Yet alternatively, as shown in FIG. 31D, for example, not only the edge portions, but also the entire protrusions (P21, P22) may be tapered.

Figure 32:
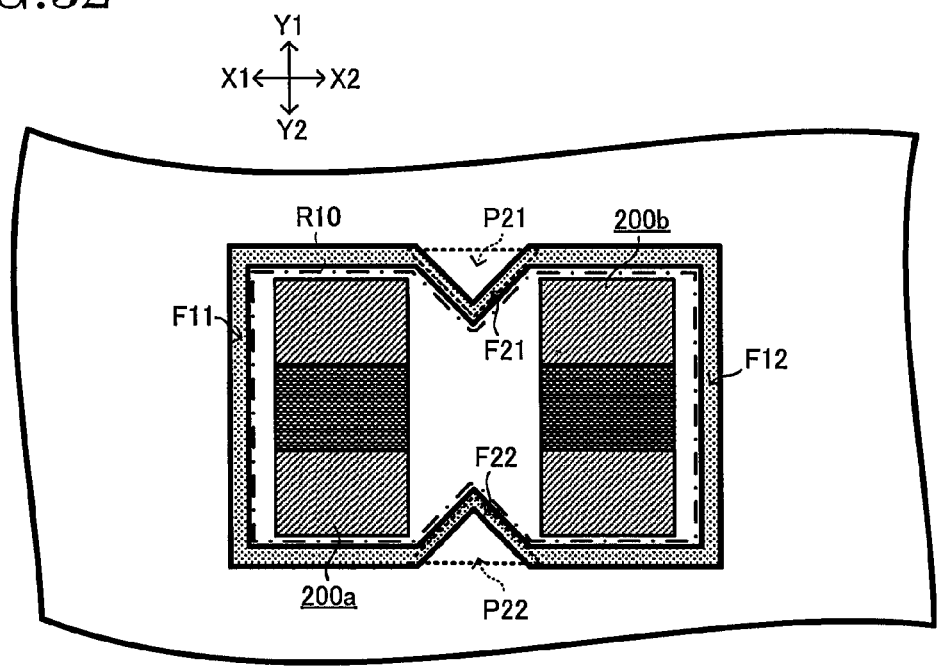
FIG. 32 is, in yet another embodiment of the present invention, a plan view showing positions of electronic devices built into a wiring board.

Positioning electronic devices to be placed in cavity (R10) (opening portion) may be determined freely. As shown in FIG. 32, for example, electronic components (200a, 200b) may be arrayed in a lateral direction.

The number of electronic devices placed in cavity (R10) (opening portion) is not limited specifically as long as it is a multiple number.

Figure 33:
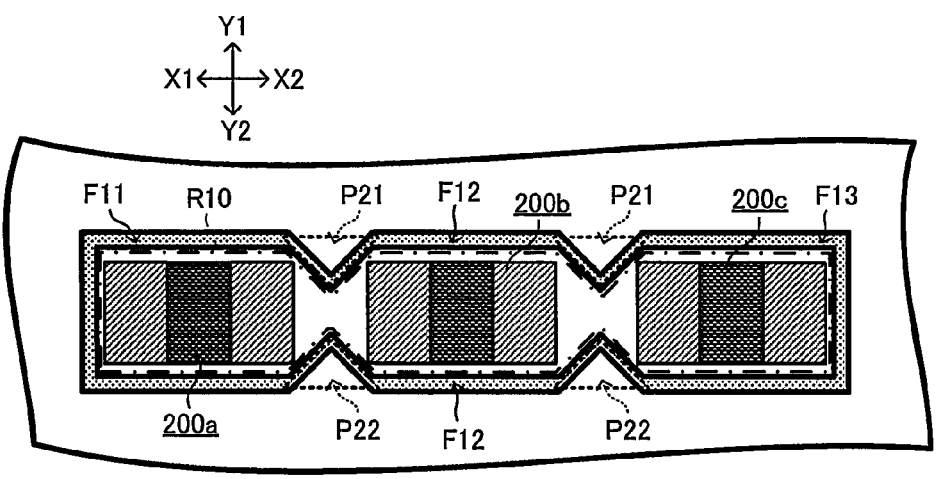
FIG. 33 is, in yet another embodiment of the present invention, a plan view showing a wiring board with three built-in electronic devices.

As shown in FIG. 33, for example, three electronic components (200a, 200b, 200c) may be accommodated in cavity (R10). In the example in FIG. 33, tips of paired protrusions (protrusions (P21, P22)) are inserted between adjacent electronic component (200a) and electronic component (200b) and between adjacent electronic component (200b) and electronic component (200c). Protrusions (P21) and protrusions (P22) are formed on the opposing wall surfaces where cavity (R10) is divided into three substantially equal parts, and their tips face each other so that the protrusions make a pair. The width of cavity (R10) is narrowed by protrusions (P21, P22), and space in cavity (R10) is divided into three spaces for accommodating electronic components (200a~200c). Electronic component (200a) is surrounded by non-protruding wall surface (F11), end surface (F21) of protrusion (P21) and end surface (F22) of protrusion (P22). Also, electronic component (200b) is surrounded by non-protruding wall surface (F12), end surface (F21) of protrusion (P21) and end surface (F22) of protrusion (P22). In addition, electronic component (200c) is surrounded by non-protruding wall surface (F13), end surface (F21) of protrusion (P21) and end surface (F22) of protrusion (P22).

Figure 34:
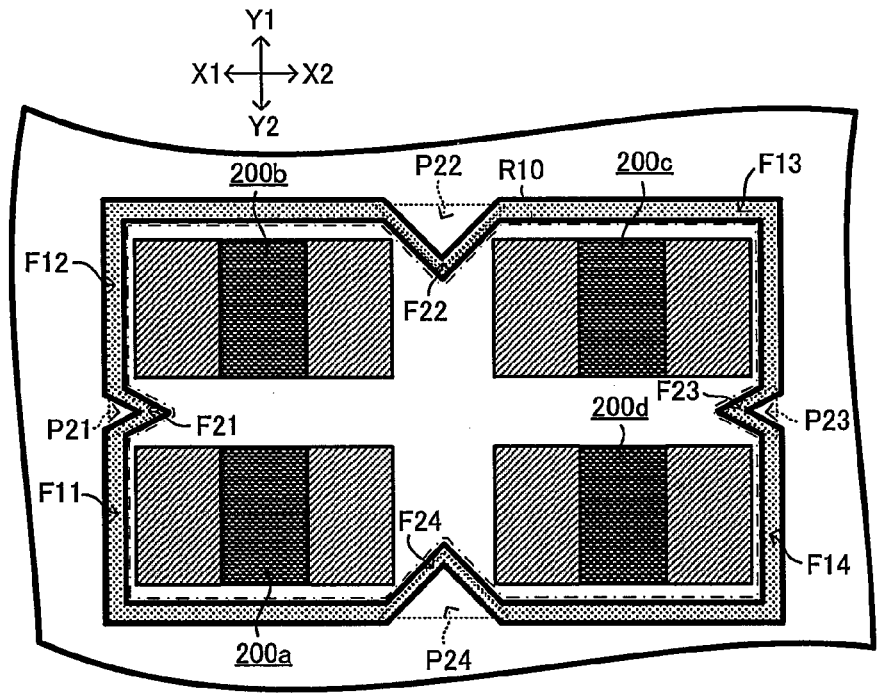
FIG. 34 is, in yet another embodiment of the present invention, a plan view showing a wiring board with four built-in electronic devices.
Figure 35:
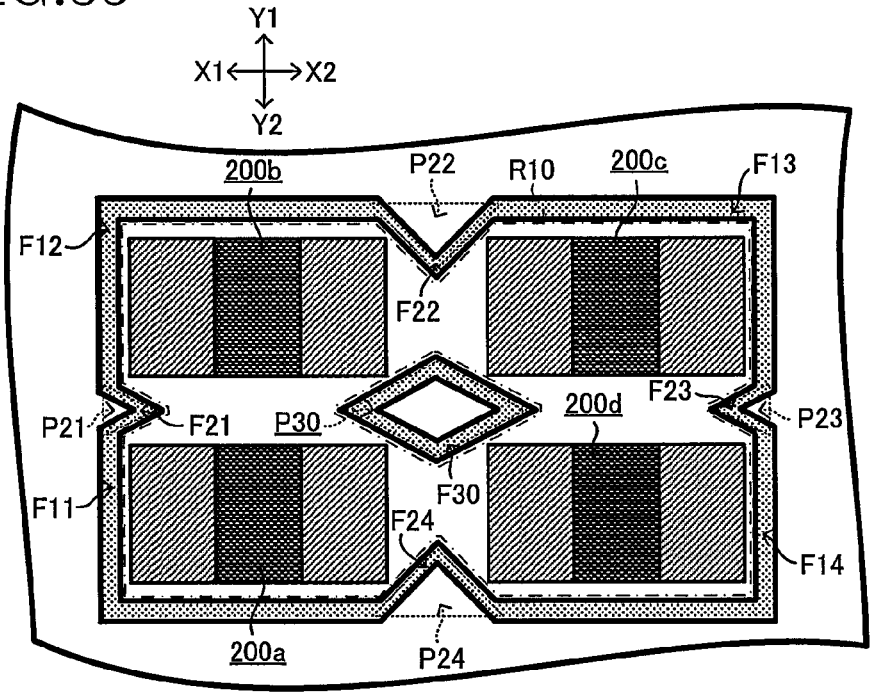
FIG. 35 is, in yet another embodiment of the present invention, a plan view showing a wiring board where each of four electronic devices is surrounded by cut surfaces of the substrate.

As shown in FIG. 34 or 35, for example, four electronic components (200a, 200b, 200c, 200d) may be accommodated in cavity (R10). In the example in FIG. 34 or 35, the tip of protrusion (P21) is inserted between adjacent electronic component (200a) and electronic component (200b), the tip of protrusion (P22) is inserted between adjacent electronic component (200b) and electronic component (200c), the tip of protrusion (P23) is inserted between adjacent electronic component (200c) and electronic component (200d), and the tip of protrusion (P24) is inserted between adjacent electronic component (200d) and electronic component (200a).

In the example in FIG. 34, electronic components (200a~200d) are surrounded by the wall surfaces of cavity (R10) (cut surfaces of substrate 100). However, electronic components (200a~200d) are not individually surrounded by the wall surfaces of cavity (R10). By contrast, in the example in FIG. 35, block (P30) in an isolated island shape as part of substrate 100 is formed among electronic components (200a~200d). Accordingly, electronic components (200a~200d) are each surrounded by cut surfaces of substrate 100. Specifically, electronic component (200a) is surrounded by non-protruding wall surface (F11), end surface (F21) of protrusion (P21), end surface (F24) of protrusion (P24) and side surface (F30) of block (P30). Also, electronic component (200b) is surrounded by non-protruding wall surface (F12), end surface (F21) of protrusion (P21), end surface (F22) of protrusion (P22) and side surface (F30) of block (P30). Also, electronic component (200c) is surrounded by non-protruding wall surface (F13), end surface (F22) of protrusion (P22), end surface (F23) of protrusion (P23) and side surface (F30) of block (P30). In addition, electronic component (200d) is surrounded by non-protruding wall surface (F14), end surface (F23) of protrusion (P23), end surface (F24) of protrusion (P24) and side surface (F30) of block (P30). Since electronic components (200a~200d) are each surrounded by cut surfaces of substrate 100, positional shifting of electronic components (200a~200d) is securely suppressed.

Figure 36:
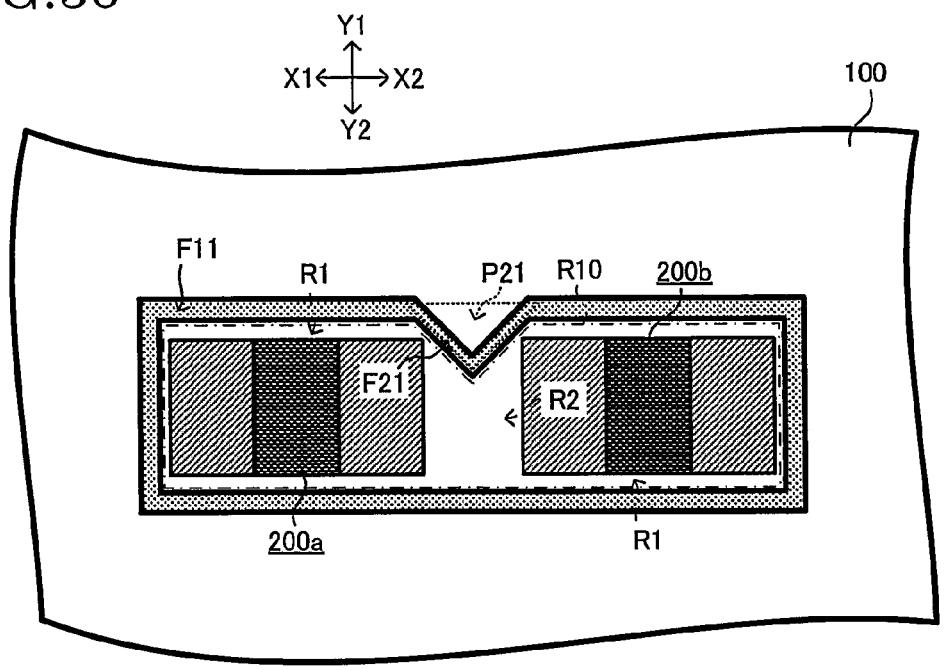
FIG. 36 is, in yet another embodiment of the present invention, a plan view showing a wiring board with a single independent protrusion.

It is not always required for paired protrusions to be formed on opposing wall surfaces of cavity (R10) (opening portion), and for their tips to face each other. For example, as shown in FIG. 36, it is an option that only protrusion (P21) is formed on a wall surface of cavity (R10) and that there is no protrusion on the opposing wall surface. If a tip of a protrusion is inserted between adjacent electronic devices in at least one location, short circuiting is prevented from occurring between adjacent electronic devices.

Figure 37:
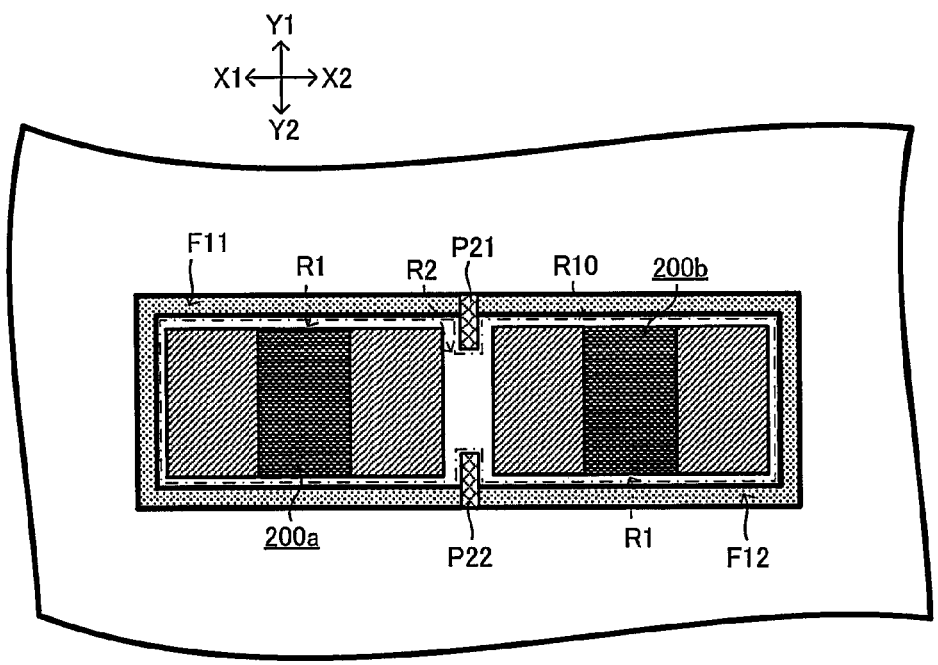
FIG. 37 is, in yet another embodiment of the present invention, a plan view showing a wiring board having protrusions prepared separately from the substrate (core substrate)

In the above embodiment, a protrusion was formed as part of substrate 100. However, a protrusion may be formed separately from substrate 100. For example, as shown in FIG. 37, substrate 100 and protrusions (P21, P22) are separately formed and protrusions (P21, P22) may be connected later using an adhesive or the like on wall surfaces of cavity (R10) (cut surfaces of substrate 100).

Figure 38:
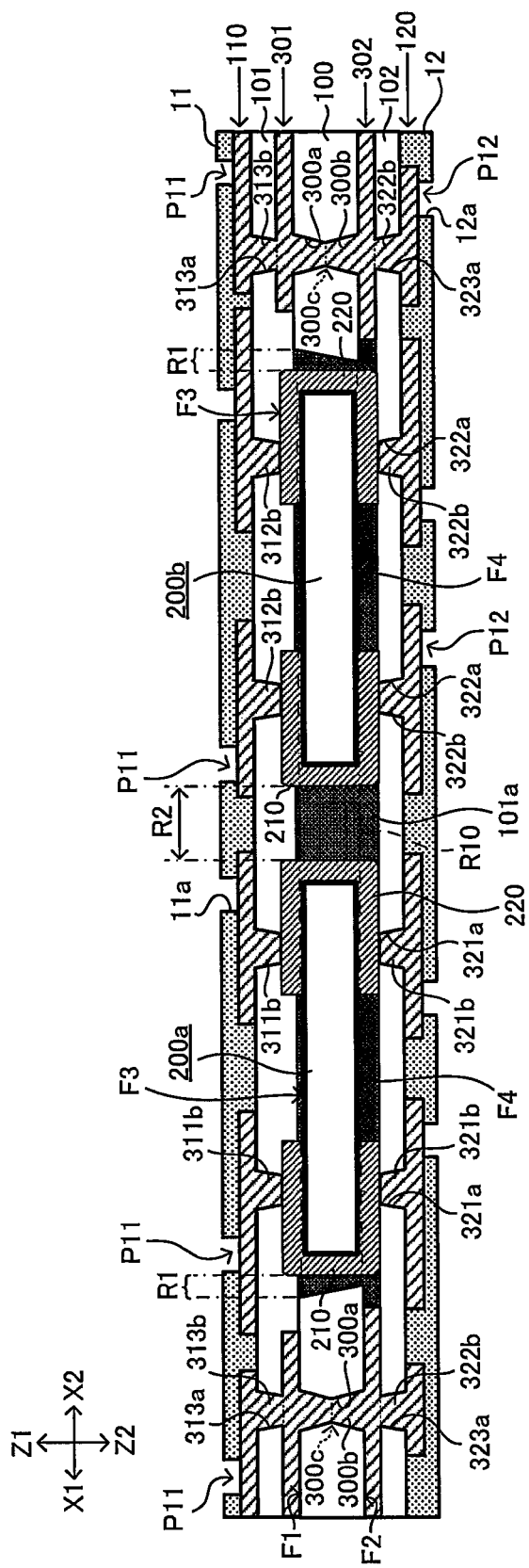
FIG. 38 is, in yet another embodiment of the present invention, a view showing a wiring board with a double-sided via structure.

A single-sided via structure was employed for electronic components (200a, 200b) in the above embodiment, but that is not the only option. For example, as shown in FIG. 38, it may be a wiring board having via conductors (311b, 312b, 321b, 322b) on both sides of electronic components (200a, 200b) to be electrically connected to electrodes (210, 220) of electronic components (200a, 200b).

Figure 39A:
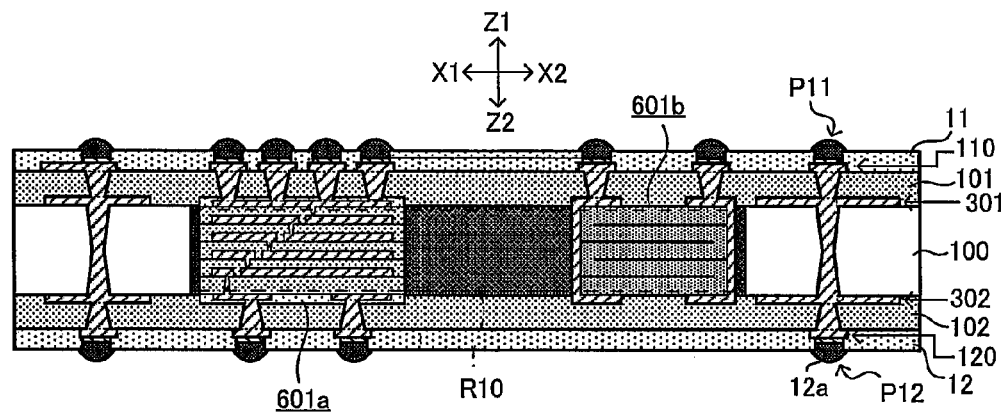
FIG. 39A is, in yet another embodiment of the present invention, a view showing a wiring board with a built-in capacitor and inductor.

Instead of capacitors, other electronic components may be built into wiring board 10. For example, as shown in FIG. 39A, electronic component (601a) containing an inductor and electronic component (601b) containing a capacitor may be accommodated in one cavity (R10). As tip (P201) of protrusion (P21) and tip (P202) of protrusion (P22) are inserted between adjacent electronic components (601a, 601b) (see FIGS. 4A, 4B), short circuiting (conduction) is suppressed between electronic components (601a) and (601b).

Figure 39B:
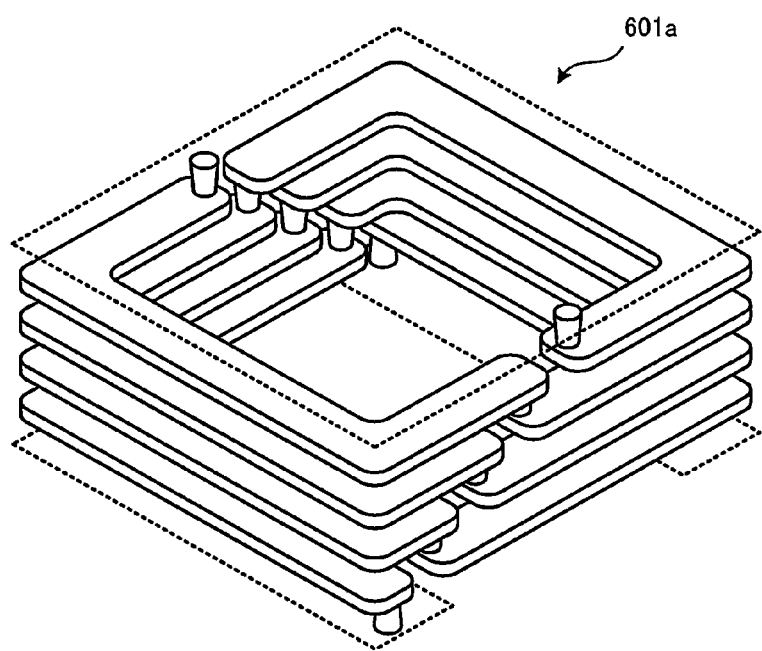
FIG. 39B is a view showing the structure of an inductor to be built into the wiring board shown in FIG. 39A.

Electronic component (601a) contains two single-coil inductors as shown in FIG. 39B, for example. Each inductor has four layers of conductive patterns arrayed to be spiral and on a plan view is substantially annular (specifically, substantially rectangular). Those inductors are connected parallel to each other.

Figure 40:
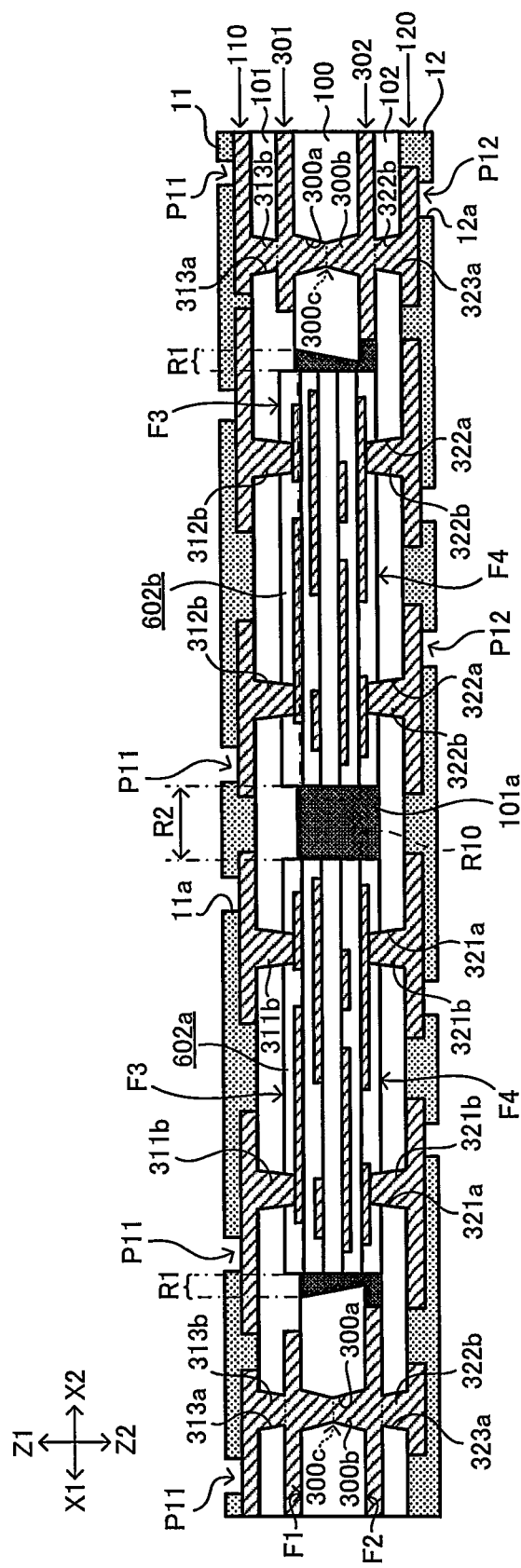
FIG. 40 is, in yet another embodiment of the present invention, a view showing a wiring board in which other wiring boards instead of electronic components are built.

Instead of electronic components, other wiring boards may be built into wiring board 10. For example, as shown in FIG. 40, wiring boards (602a, 602b) may be accommodated in one cavity (R10). As tip (P201) of protrusion (P21) and tip (P202) of protrusion (P22) are inserted between adjacent wiring boards (602a, 602b) (see FIGS. 4A, 4B), short circuiting (conduction) is suppressed between wiring boards (602a) and (602b).

Pads (external connection terminals) of wiring board (602a) are electrically connected to conductive layers (110, 120) by via conductors (311b, 321b). Pads (external connection terminals) of wiring board (602b) are electrically connected to conductive layers (110, 120) by via conductors (312b, 322b). Wiring boards (602a, 602b) are preferred to have higher density conductors than wiring board 10 by having a fine conductive pattern in each conductive layer or by having a thinner interlayer insulation layer between conductive layers, for example.

Figure 41:
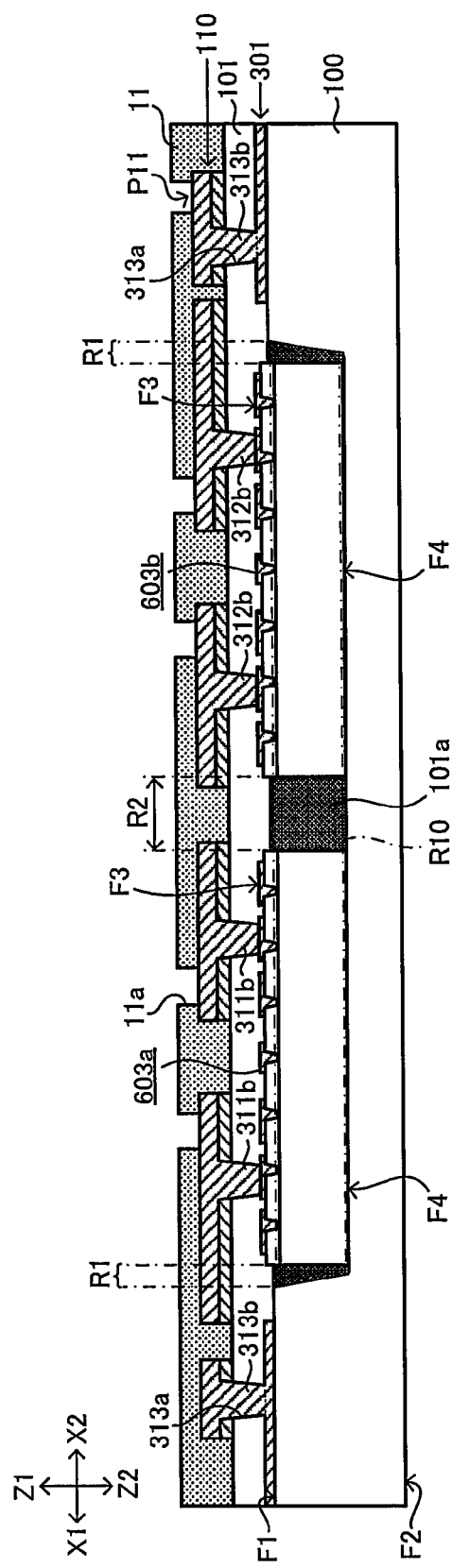
FIG. 41 is, in yet another embodiment of the present invention, a view showing a single-sided wiring board.

A double-sided wiring board (wiring board 10) having conductive layers on both sides of a core substrate is shown in the above embodiment, but that is not the only option. For example, as shown in FIG. 41, it is an option to use a single-sided wiring board having a conductive layer only on one side of the core substrate (substrate 100). In the example in FIG. 41, electronic components (603a, 603b) containing IC chips are accommodated in one cavity (R10).

Also, as shown in FIG. 41, for example, cavity (R10) (accommodation space for electronic components (200a, 200b) may be a hole that does not penetrate through substrate 100 (concave portion).

The above embodiment showed an example in which the thickness of substrate 100 is substantially the same as the thickness of electronic components (200a, 200b). However, that is not the only option, and as shown in FIG. 41, for example, the thickness of substrate 100 may be greater than the thickness of electronic components (200a, 200b).

It may also be a wiring board having two or more buildup layers on one side of the core substrate. In addition, the number of buildup layers may be different on the first-surface (F1) side of substrate 100 and on the second-surface (F2) side of substrate 100. However, to mitigate stress, it is considered preferable to enhance symmetry of the upper and lower surfaces by setting the number of buildup layers the same on the first-surface (F1) side of substrate 100 and on the second-surface (F2) side of substrate 100.

Figure 42:
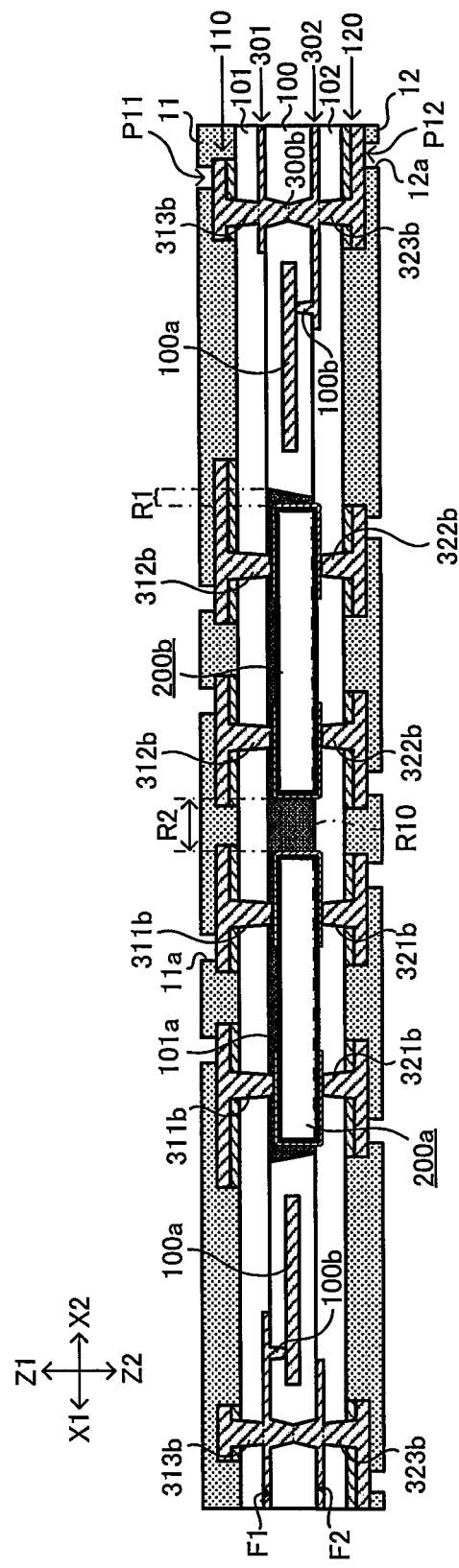
FIG. 42 is, in yet another embodiment of the present invention, a view showing a wiring board having a core substrate with a built-in metal sheet.

As shown in FIG. 42, substrate 100 (core substrate) may be an insulative substrate with built-in metal sheet (100a) (copper foil, for example). In such substrate 100, heat dissipation is enhanced by metal sheet (100a). In the example in FIG. 42, via conductors (100b) are formed in substrate 100 to reach metal sheet (100a), and metal sheet (100a) and ground lines (conductive patterns included in conductive layers (301, 302) are electrically connected to each other by via conductors (100b). Metal sheet (100a) is not limited to being planar and it may be shaped to be rectangular or circular.

In the following, an example of a method for manufacturing substrate 100 (core substrate) shown in FIG. 42 is described by referring to FIGS. 43A and 43B.

Figure 43A:
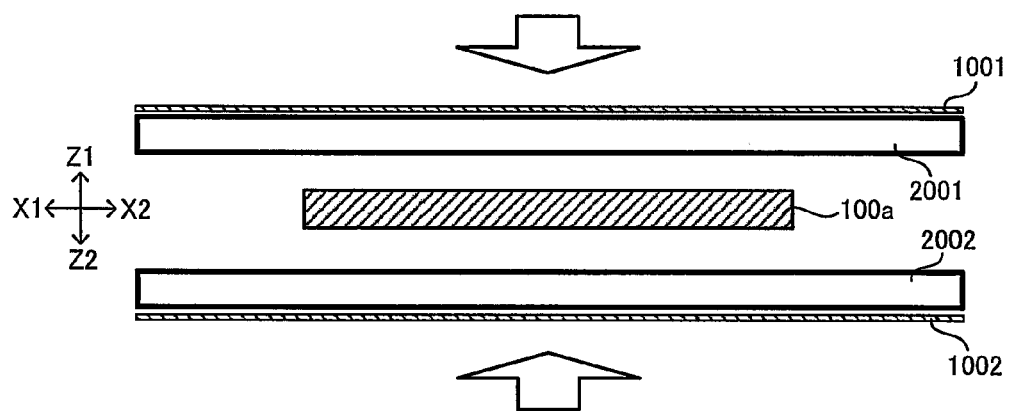
FIG. 43A is a view to illustrate a first step for manufacturing a core substrate to be used in the wiring board shown in FIG. 42.
Figure 43B:
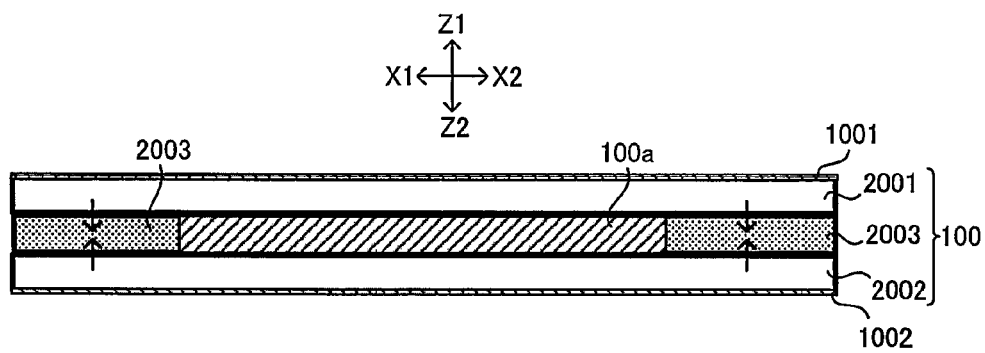
FIG. 43B is a view to illustrate a second step subsequent to the step in FIG. 43A.

First, as shown in FIG. 43A, insulation layers (2001, 2002) are positioned to sandwich metal sheet (100a) made of copper foil, for example. Then, copper foil 1001 is further positioned on insulation layer 2001, and copper foil 1002 is positioned on insulation layer 2002. Insulation layers (2001, 2002) are each made of glass-epoxy prepreg, for example.

Next, pressure is exerted toward metal sheet (100a) by pressing. By pressing semicured insulation layers (2001, 2002), resin is respectively flowed from insulation layers (2001, 2002) as shown in FIG. 43B. Accordingly, insulation layer 2003 is formed in side directions of metal sheet (100a). Then, insulation layers (2001, 2002, 2003) are each thermally cured. Accordingly, substrate 100 (core substrate) with built-in metal sheet (100a) is completed.

The structure of wiring board 10, as well as the type, performance, measurements, quality, shapes, number of layers, positioning and so forth of the elements of such a structure, may be modified freely within a scope that does not deviate from the gist of the present invention.

The electrodes of chip capacitors positioned in cavity (R10) (opening portion) are not limited to being U-shaped. For example, they may be a pair of planar electrodes to sandwich capacitor body 201.

The type of electronic devices to be positioned in cavity (R10) (opening portion) may be determined freely, and any type of electronic components may be employed. For example, in addition to passive components such as a capacitor, resistor and inductor, active components such as an IC circuit may also be used.

Each via conductor is not limited to being a filled conductor, and may be a conformal conductor, for example.

Electronic devices to be positioned in cavity (R10) (opening portion) may be mounted using other methods such as wire bonding, instead of via connections (via conductors).

A method for manufacturing a wiring board is not limited to the order and contents shown in FIG. 8 above. Its order and contents may be modified within a scope that does not deviate from the gist of the present invention. Also, steps may be omitted if not required, depending on usage or the like.

For example, any method may be taken for forming each conductive layer. For example, any one method of the following or any combination of two or more of them may be used for forming conductive layers: panel plating, pattern plating, full-additive, semi-additive (SAP), subtractive, transfer and tenting methods.

Also, instead of a laser, wet or dry etching may be used for processing. When an etching process is employed, it is considered preferable to protect in advance with resist or the like portions which are not required to be removed.

The above embodiment and modified examples may be combined freely. Selecting an appropriate combination according to usage requirements or the like is considered preferable. For example, it is an option to make a combination of any planar shape of protrusions shown in FIGS. 25~30, any cross-sectional shape of protrusions shown in FIGS. 31A~31D, and any number and positioning of electronic devices shown in FIGS. 32~36.

A wiring board according to an embodiment of the present invention includes a substrate with an opening portion, multiple electronic devices positioned in the opening portion, an insulation layer formed on the substrate and the electronic devices, and a conductive layer formed on the insulation layer. In such a wiring board, a protrusion is formed on a wall surface of the opening portion, and the tip of the protrusion is inserted between adjacent electronic devices in at least one location.

A method for manufacturing a wiring board according to another embodiment of the present invention includes the following: preparing a substrate; forming in the substrate an opening portion having a protrusion on its wall surface; positioning multiple electronic devices in the opening portion so that a tip of the protrusion is inserted at least in one location between adjacent electronic devices; forming an insulation layer on the substrate and on the electronic devices; and forming a conductive layer on the insulation layer.

A wiring board according to an embodiment of the present invention is suitable for forming electrical circuits in a built-in electronic component. Also, a method for manufacturing a wiring board according to an embodiment of the present invention is suitable for manufacturing wiring boards.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a substrate having an opening portion;
a plurality of electronic devices positioned in the opening portion such that the electronic devices are arrayed in a lateral direction of each of the electronic devices; and
an insulation layer formed on the substrate such that the insulation layer covers the electronic devices in the opening portion of the substrate,
wherein the substrate has a wall surface defining the opening portion such that the wall surface is partially partitioning the opening portion and keeping the electronic devices from making contact with each other, and the wall surface of the substrate has a pair of protrusions positioned such that tips of the protrusions face each other.

2. The wiring board according to claim 1, further comprising a conductive layer formed on the insulation layer.

3. The wiring board according to claim 1, wherein the opening portion is partitioned into two portions having a substantially equal size.

4. The wiring board according to claim 1, wherein the wall surface of the substrate is a cut surface of the substrate surrounding the plurality of electronic devices.

5. The wiring board according to claim 1, wherein the wall surface of the substrate is a tapered surface of the substrate surrounding the plurality of electronic devices.

6. The wiring board according to claim 1, wherein at least one of the electronic devices is a chip capacitor having an electrode extending from one surface of the chip capacitor to an opposite surface of the chip capacitor through a side surface of the chip capacitor connecting the one surface and opposite surface of the chip capacitor.

7. The wiring board according to claim 1, wherein at least one of the electronic devices is an inductor.

8. The wiring board according to claim 1, wherein the electronic devices form a gap between the wall surface of the substrate and the electronic devices in the opening portion, and the gap is filled with a resin derived from the insulation layer.

9. The wiring board according to claim 1, further comprising a plurality of external connection terminals formed directly over the electronic devices.

10. The wiring board according to claim 1, further comprising:
   a conductive layer formed on the insulation layer; and
   a plurality of via conductors formed in a plurality of via holes formed in the insulation layer,
   wherein the conductive layer is connected to electrodes of the electronic devices through the via conductors.

11. The wiring board according to claim 1, wherein the substrate is an insulative substrate having a built-in metal sheet.

12. The wiring board according to claim 1, wherein the wall surface of the substrate has the pair of protrusions formed such that each of the protrusions is tapering toward the tips of the protrusions.

13. The wiring board according to claim 1, wherein the wall surface of the substrate has the pair of protrusions formed such that each of the protrusions has a skirt portion and a rectangular tip portion.

14. The wiring board according to claim 1, wherein the wall surface of the substrate has the pair of protrusions formed such that each of the protrusions has a rectangle shape.

15. The wiring board according to claim 1, wherein the wall surface of the substrate has the pair of protrusions formed such that each of the protrusions is a cut surface of the substrate.

16. The wiring board according to claim 2, wherein the electronic devices form a gap between the wall surface of the substrate and the electronic devices in the opening portion, and the gap is filled with a resin derived from the insulation layer.

17. The wiring board according to claim 10, wherein the electronic devices form a gap between the wall surface of the substrate and the electronic devices in the opening portion, and the gap is filled with a resin derived from the insulation layer.

18. A method for manufacturing a wiring board, comprising:
   forming in a substrate an opening portion which accommodates a plurality of electronic devices and which is defined by a wall surface such that the wall surface is partially partitioning the opening portion to keep the electronic devices from making contact with each other in the opening portion;
   positioning a plurality of electronic devices in the opening portion such that the wall surface of the substrate keeps the electronic devices from making contact with each other and that the electronic devices are arrayed in a lateral direction of each of the electronic devices in the opening portion of the substrate; and
   forming an insulation layer on the substrate such that the insulation layer covers the electronic devices in the opening portion of the substrate,
   wherein the forming of the opening portion comprises cutting the substrate such that the wall surface having a pair of protrusions having tips facing each other and partially partitioning the opening portion is formed.

19. The method for manufacturing a wiring board according to claim 18, further comprising forming a conductive layer on the insulation layer.

20. The method for manufacturing a wiring board according to claim 18, further comprising filling a resin derived from the insulation layer into a space formed between the wall surface of the substrate and the electronic devices in the opening portion of the substrate.

21. The method for manufacturing a wiring board according to claim 18, further comprising:
   forming a plurality of via holes in the insulation layer;
   forming a conductive layer on the insulation layer; and
   forming a plurality of via conductors in the plurality of via holes, respectively, such that the conductive layer is connected to electrodes of the electronic devices in the opening portion through the via conductors.

* * * * *